(12) United States Patent
Takei et al.

(10) Patent No.: US 7,511,419 B2
(45) Date of Patent: Mar. 31, 2009

(54) LUMINESCENT PANEL HAVING A REFLECTING FILM TO REFLECT LIGHT OUTWARDLY WHICH IS SHAPED TO CONDENSE THE REFLECTED LIGHT

(75) Inventors: Manabu Takei, Sagamihara (JP); Tomoyuki Shirasaki, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 551 days.

(21) Appl. No.: 10/484,671

(22) PCT Filed: May 14, 2002

(86) PCT No.: PCT/JP03/05998

§ 371 (c)(1),
(2), (4) Date: Jan. 22, 2004

(87) PCT Pub. No.: WO03/096755

PCT Pub. Date: Nov. 20, 2003

(65) Prior Publication Data

US 2004/0211971 A1    Oct. 28, 2004

(30) Foreign Application Priority Data

May 14, 2002 (JP) ............................ 2002-138285

(51) Int. Cl.
*H01J 5/16* (2006.01)
*H01J 1/62* (2006.01)

(52) U.S. Cl. .................. 313/506; 313/110; 313/113

(58) Field of Classification Search ................ 313/506, 313/110–114, 501, 503, 504, 509, 510; 349/69, 349/70, 113, 627, 494; 359/627, 494
See application file for complete search history.

(56) References Cited

U.S. PATENT DOCUMENTS

| | | | | |
|---|---|---|---|---|
| 5,404,075 A | * | 4/1995 | Fujikawa et al. | 313/509 |
| 5,894,196 A | * | 4/1999 | McDermott | 313/512 |
| 6,091,197 A | * | 7/2000 | Sun et al. | 313/509 |
| 6,479,929 B1 | * | 11/2002 | Knabenbauer | 313/484 |
| 6,787,976 B2 | * | 9/2004 | Minoura et al. | 313/506 |
| 2002/0079835 A1 | * | 6/2002 | Lee | 313/506 |

FOREIGN PATENT DOCUMENTS

| | | |
|---|---|---|
| CN | 1291354 A | 4/2001 |
| DE | 297 08 997 U1 | 10/1997 |
| EP | 0 163 351 A1 | 12/1985 |

(Continued)

OTHER PUBLICATIONS

Japanese Office Action (and English translation) dated Mar. 4, 2008, issued in a counterpart Japanese Application.

*Primary Examiner*—Karabi Guharay
(74) *Attorney, Agent, or Firm*—Frishauf, Holtz, Goodman & Chick, P.C.

(57) ABSTRACT

A luminescent panel includes a transparent substrate, a first transparent electrode provided on the transparent substrate, a luminescent layer provided on the first transparent electrode, and a second transparent electrode provided on the luminescent layer. A reflecting film provided on the second electrode, reflects light emitted from the luminescent layer through the second transparent electrode and causes the reflected light to outwardly emit from the transparent substrate.

1 Claim, 18 Drawing Sheets

FOREIGN PATENT DOCUMENTS

| | | |
|---|---|---|
| EP | 0 369 755 A2 | 5/1990 |
| EP | 1065723 A2 * | 1/2001 |
| JP | 09-326297 A | 12/1997 |
| JP | 10-223367 A | 8/1998 |
| JP | 11-026813 A | 1/1999 |
| JP | 2000-098361 A | 4/2000 |
| JP | 2001-217078 A | 8/2001 |
| JP | 2002-043054 A | 2/2002 |
| JP | 2002-118290 A | 4/2002 |

* cited by examiner

LUMINESCENT PANEL HAVING A REFLECTING FILM TO REFLECT LIGHT OUTWARDLY WHICH IS SHAPED TO CONDENSE THE REFLECTED LIGHT

This application is a U.S. National Phase Application under 35 USC 371 of International Application PCT/JP03/05998 filed May. 14, 2003.

TECHNICAL FIELD

The present invention relates to a luminescent panel including an optical member which improves an emitting efficiency.

BACKGROUND ART

Generally, since an EL element is a self-luminous type element, it is used as a backlight in a liquid crystal display, a light source in a printer head, a segment in a segment type display, a pixel in a matrix type display and others. In particular, a display in which the EL element functions as a pixel achieves a wide field angle, high contrast, an excellent visual recognition property, a low power consumption, a good shock resistance and others. As the EL elements, there are an inorganic EL element which is a thin film structure in which insulating films are interposed between an EL layer using an inorganic compound as a luminescent material and a pair of electrodes, and an organic EL element which is a laminated structure using an organic compound as a luminescent material.

FIG. 22 shows a structure of a typical luminescent panel using organic EL elements. A luminescent panel 901 is constituted by sequentially laminating an anode electrode 903, an organic EL layer 904 including a luminescent material and a cathode electrode 905 on one surface 902a of a transparent substrate 902. The organic EL layer 904 may have a three-layer structure including a hole transport layer, a luminescent layer and an electron transport layer laminated on the cathode electrode 903 in the mentioned order, a two-layer structure consisting of an electron hole transport layer and a luminescent layer from the side of the anode electrode 903 in the mentioned order, a single-layer structure consisting of a luminescent layer, or a laminated structure that transport of electrons or electron holes is interposed between appropriate layers in the former layer structures.

In the luminescent panel 901, when a forward bias voltage is applied between the anode electrode 903 and the cathode electrode 905, the electron holes are injected into the organic EL layer 904 from the anode electrode 903, and the electrons are injected into the organic EL layer 904 from the cathode electrode 905. When the electron holes and the electrons are transported into the organic EL layer 904 and the electron holes and the electrons are re-combined in the organic EL layer 904, excitons are generated, and a fluorescent material in the organic EL layer 904 is excited by the excitons whereby light is generated in the organic EL layer 904.

Generally, the luminescent panel 901 uses the anode electrode 903 as a transparent electrode, and the light is emitted toward the outside from the other surface 902b of the transparent substrate 902. At this moment, since the light emitted from the organic EL layer 904 spreads in a radial pattern, the light emitting efficiency is improved in the luminescent panel 901 by providing the light blocking effect to the cathode electrode 905.

Since the light does not have the directivity in the luminescent panel 901 and the light emitted from the organic EL layer 904 spreads in a radial pattern, a part of the light passing through the transparent substrate 902 is scattered in the transparent substrate 902, thereby reducing the light emitting efficiency from the transparent substrate 902 to the outside.

Further, when the luminescent panel 901 is used in a matrix type display, since the light emitted from the organic EL layer 904 spreads in a radial pattern, it is hard to sufficiently increase the contrast of a display screen in the front face direction.

Thus, the present invention is advantageous in increasing the light emitting efficiency of the light emission panel by a light emission element such as an organic EL element forming a laminated structure laminated on a transparent substrate and providing the directivity to light emission of a luminescent panel.

DISCLOSURE OF INVENTION

According to one aspect of the present invention, there is provided a luminescent panel comprising:

a transparent substrate;

a first transparent electrode provided on one surface of the transparent substrate;

a luminescent layer provided on the first transparent electrode;

a second transparent electrode provided on the to luminescent layer, at least one pixel being defined by the first transparent electrode, the luminescent layer and the second transparent electrode; and a reflecting film which reflects light radiated from the luminescent layer through the second transparent electrode and causes the reflected light to outgo from the transparent substrate.

In this luminescent panel, when the luminescent layer emits the light, a part of the light is transmitted through the first electrode and the transparent substrate as it is and outgoes from the other surface of the transparent substrate. On the other hand, the remaining part of the light is transmitted through the second electrode and then reflected on the reflecting film. The reflected light is transmitted through the second electrode, the luminescent layer, the first electrode and the transparent substrate, and outgoes from the other surface of the transparent substrate. Here, the reflecting film need not closely contact the luminescent layer as the second electrode. That is, when the luminescent layer is flat, the second electrode film must be also formed flatly, whereas the reflecting film can be set to an arbitrary shape irrespective of the shape of the luminescent layer. Therefore, since the reflecting film can arbitrarily control the reflected light, the emitting efficiency of the light from the transparent substrate side can be improved.

The reflecting film functions as a concave mirror when it is formed to have a concave portion, and the front face brightness can be improved in particular. Also, it is possible to perform display with the extremely high contrast ratio with respect to a viewer from the front side. In particular, when this luminescent panel is used as a personal small panel, visual recognition is performed almost only from the front side, which is very effective. Further, in order to readily define the shape of the reflecting film, a lens may be provided on the inner side or the outer side of the reflecting film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF DRAWINGS

The accompanying drawings, which are incorporated in and constitute a part of the specification, illustrate embodiments of the invention, and together with the general description given above and the detailed description of the embodiments given below, serve to explain the principles of the invention.

BEST MODE FOR CARRYING OUT THE INVENTION

Concrete modes of the present invention will now be described hereinafter with reference to the accompanying drawings. However, a scope of the present invention is not restricted to illustrated embodiment. It is to be noted that, in the embodiments, "seen from a plane surface" means "seen from a direction of a substantial normal line of a light emitting surface 2b of a transparent substrate 2".

Figure 1A:
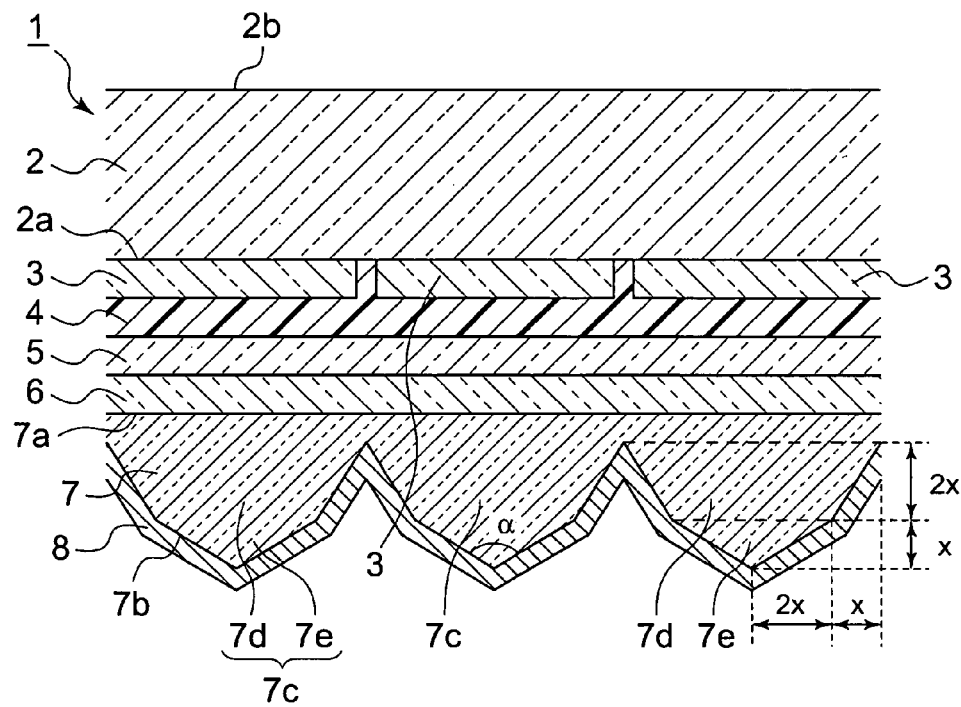
FIG. 1A is a cross-sectional view showing a part of a luminescent panel according to a first embodiment of the present invention.

FIG. 1A is a cross-sectional view showing a part of a luminescent panel to which the present invention is applied.

This luminescent panel 1 has as a basic structure a laminated structure in which an anode electrode 3, an organic EL layer 4 (luminescent layer in the broad sense) and a cathode electrode 5 are sequentially laminated on one flat surface 2a of a transparent substrate 2 having a substantially tabular shape in the mentioned order. The anode electrode 3 is constituted by many anode electrode sections or stripes which are separated from each other at predetermined intervals, provided to protrude from one surface of the organic EL layer 4 and extend in a row direction. A plurality of positions where each section of the anode electrode 3 and the cathode electrode 5 cross each other with the organic EL layer 4 therebetween are defined as respective pixels, and each pixel selectively emits the light in accordance with a voltage or a current applied to the anode electrode 3 and the cathode electrode 5.

The transparent substrate 2 has a refraction factor of 1.3 to 1.6, a thickness of 0.1 mm to 1.3 mm, the transmissivity with respect to the visible light and the insulation property, and it is formed of a material such as borosilicate glass, quartz glass or any other glass.

The film of the anode electrode 3 is formed on one surface 2a of the transparent substrate 2. The anode electrode 3 has the conductivity and the transmissivity with respect to the visible light. Furthermore, as the anode electrode 3, one which can efficiently inject electron holes to the organic EL layer 4 is preferable. The anode electrode 3 is formed of, e.g., an indiumtin-oxide (ITO), a zinc-doped indium oxide (In—Zn—O), an indium oxide ($In_2O_3$), a tin oxide ($SnO_2$), a zinc oxide (ZnO) or the like, has a refraction index of approximately 2.0 to 2.2 and a thickness of 50 nm to 200 nm.

The organic EL layer 4 is formed with a thickness of 20 nm to 200 nm on the anode electrode 3. The organic EL layer 4 may include various charge transport layers. For example, the organic EL layer 4 may have a three-layer structure having an electron hole transport layer, a narrow-sense luminescent layer, and an electron transport layer superimposed on the anode electrode 3 in the mentioned order, or a two-layer structure having an electron holes transport layer and a luminescent layer in a narrow sense superimposed on the anode electrode 3, or a structure having one layer consisting of a narrow-sense luminescent layer, four or more layers, or a structure having an electron transport layer or an electron transport layer interposed between appropriate layers in such layer structures, or any other structure. A refraction factor of the organic EL layer 4 is approximately 1.3 to 1.6.

The organic EL layer 4 has a function to transport electron holes and electrons and a function to generate excitons by re-coupling of the electron holes and the electrons and emit the light. It is desirable that the organic EL layer 4 is an organic chemical compound which is electronically neutral, and the electron holes and the electrons are thereby injected and transported in the organic EL layer 4 in the well-balanced manner. Further, a material having an electron transport property may be appropriately mixed in the narrow-source luminescent layer, a material having an electron hole transport property may be appropriately mixed in the narrow-source luminescent layer, or a material having an electron transport property and a material having an electron transport property may be appropriately mixed in the narrow-source luminescent layer. A luminescent material (fluorescent material) is included in the organic EL layer 4. This luminescent material may be a high-molecular-based material or a low-molecular-based material.

The film of the cathode electrode 5 is formed on the organic EL layer 4. The cathode electrode 5 has a transmissivity with respect to the visible light. Furthermore, it is desirable that the cathode electrode 5 is formed of a material with a relatively low work function in light of an electron injection property. As the cathode electrode 5, it is desirable to adopt one which has a laminated structure that the film of the electron injection layer constituted by an elemental substance with a low work function, e.g., indium, magnesium, calcium, lithium or barium, or an alloy or a mixture including at least one kind of these materials is formed with a thickness of approximately 2 nm to 15 nm on the organic EL layer 4 and the film of the high-transmissivity layer such as ITO is formed with a thickness of 50 nm to 200 nm on the electron injection layer, and the laminated structure of which transmits therethrough not more than 70% of the visible light.

A lens array (fly-eye lens or fly-eye lenses) 7 having a plurality of minute convex lenses aligned therein in the matrix form is bonded to the cathode electrode 5 by an optical adhesive 6. The optical adhesive 6 has a transmissivity with respect to the visible light, and a refraction factor approximating a refraction factor of the high-transmissivity layer of the cathode electrode 5 or a refraction factor of the lens array 7. In this embodiment, although Canada balsam is used as the optical adhesive 6, the optical adhesive is not restricted to Canada balsam.

The lens array 7 has a flat surface 7a which is bonded to the cathode electrode 5. On the other surface 7b of the lens array 7 are arranged a plurality of convex lenses 7c in the matrix form with a pitch of 1 μm to 200 μm, or more desirably 25 μm to 75 μm when seen from the plane surface. Each convex lens 7c has such a shape as that a bottom surface of a circular cone 7e is superimposed on an upper surface of a truncated cone 7d, a ratio of a height 2x of the truncated cone 7d and a height x of the circular cone 7e is 2:1, and a ratio of a radius 3x of the bottom surface of the truncated cone 7d and a radius 2x of the bottom surface of the circular cone 7e is 3:2. Therefore, an apex angle α of the circular cone 7e is set to 120°.

A reflecting film 8 is formed on an irregular surface or concave/convex surface 7b of the lens array 7. The reflecting film 8 has a reflectivity with respect to the visible light. As a material of the reflecting film 8, there may be used aluminium, silver and an alloy of these materials, but the material of the reflecting film 8 does not have to be restricted them as long as the irregular surface 7b of the lens array 7 is a mirror finished surface and can reflect the visible light. As a method of forming the reflecting film 8, there are a sputtering method, a vapor deposition method and others, it is not necessary to restrict it to them.

Since the convex lens 7c has a concave shape protruding in a direction opposite to a direction toward the transparent substrate 2, one convex lens 7c and a part of the reflecting film 8 form one concave mirror when viewing the lens array 7 from the transparent substrate 2. This concave mirror faces the cathode electrode 5, and the cathode electrode 5 is interposed between the concave mirror and the anode electrode 3.

As a method of manufacturing the luminescent panel 1 having the above-described structure, the film of the anode electrode 3 is first formed on the flat surface 2a of the transparent substrate 2, and the film of the organic EL layer 4 is formed on the anode electrode 3. Then, the film of the cathode electrode 5 is formed on the organic EL layer 4. On the other hand, the film of the reflecting film 8 is formed on the irregular surface 7b of the lens array 7. Then, the optical adhesive 6 is applied on at least one of the cathode electrode 5 on the transparent substrate 2 side and the flat surface 7a of the lens array 7, and the optical adhesive 6 is used to bond the flat surface 7a of the lens array 7 to the cathode electrode 5. The optical adhesive 6 is cured, thereby bringing the luminescent panel 1 to completion.

Figure 2:
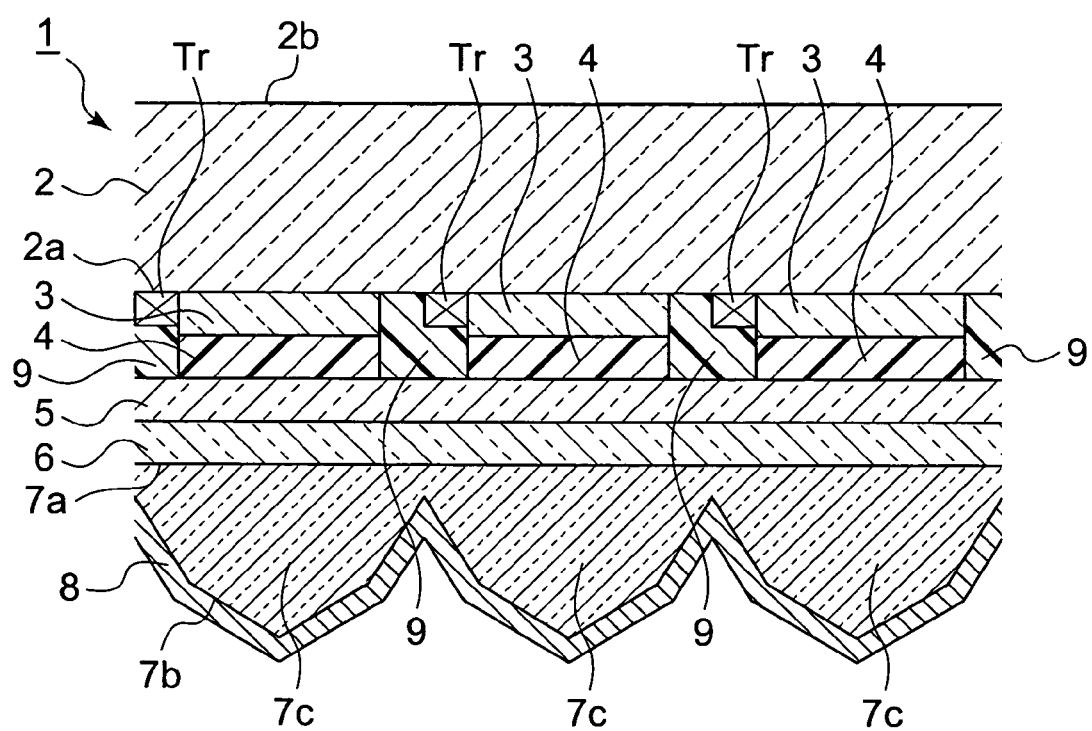
FIG. 2 is a cross-sectional view showing a part of the luminescent panel including a switching element.

In case of using the luminescent panel 1 as a display panel of an active matrix display type display, as shown in FIG. 2, it is good enough to partition the anode electrode 3 and the organic EL layer 4 in the matrix form when seen from the plane surface (that is, it is good to define a plurality of rectangular anode electrode sections and organic EL sections distanced from each other in the line direction and the row direction). In this case, the anode electrode sections and the organic EL layer sections are partitioned by an insulative partition wall 9 formed in the mesh form or a plurality of walls when seen from the plane surface, the cathode electrode 5 which can function as a common electrode is arranged so as to cover the organic EL layers 4 and the partition wall 9. In the organic EL element which becomes each pixel in this manner, a luminescent area is partitioned by each section of the anode electrode 3 partitioned by the partition wall 9, and a transistor Tr provided in the partition wall 9 is connected as a switching element to each section of the anode electrode 3. One or more transistors Tr are provided in accordance with each pixel. An a-Si/TFT or p-Si/TFT is preferable as the transistor. A capacitor connected to the transistor Tr may be provided for each pixel according to needs.

Each convex lens 7c is arranged in accordance with each pixel (organic EL element), and one concave mirror constituted by one convex lens 7c and a part of the reflecting film 8 faces each organic EL layer 4 of the organic EL element. It is to be noted that the cathode electrode 5 of each organic EL element is determined as an electrode common to all the pixels, but the electrode connected to the transistor Tr may be determined as a cathode electrode whose side close to the transparent substrate 2 is patterned in accordance with each pixel with respect to the organic EL layer 4, and the anode electrode may be determined as one common electrode so as to cover the partition wall 9 and the organic EL layer 4. At this moment, when the cathode electrode is configured to have an electron injection layer and a high-transmissivity layer as described above, providing the electron injection layer on the organic EL layer 4 side can suffice.

Moreover, in case of a simple matrix, between a plurality of the partition walls 9 arranged so as to be separated from each other by a predetermined distance along the line direction when seen from the plane surface may be arranged each anode electrode 3 likewise provided along the line direction, and the organic EL layer 4 is formed on the surface of the anode electrode 3. Thereafter, a plurality of the cathode electrodes 5 separated from each other by a predetermined distance may be formed on the surface of the organic EL layer 4 along the row direction orthogonal to the line direction.

When a step is generated in the plane direction by the transistor Tr and the partition walls 9 or the anode electrode 3 and the organic EL layer 4, since the optical adhesive 6 having the flexibility when unhardened is interposed in a gap produced in the irregularities so as to cancel out the irregularities, the lens array 7 can be stably bonded to the transparent substrate 2 in parallel.

As a method of manufacturing the luminescent panel 1 shown in FIG. 2, a plurality of the anode electrodes 3 are patterned in the matrix form on the flat surface 2a of the transparent substrate 2 by appropriately performing a thin film formation step such as a vapor evaporation method, a sputtering method or a CVD method, a masking step such as a photolithography method, or the thin film shape manufacturing step such as an etching method. Then, wirings connecting the transistors Tr and a drive circuit which controls the transistors Tr and the pixels are formed between a plurality of the anode electrodes 3 on the transparent substrate 2.

Subsequently, each partition wall 9 is formed on the transistor Tr and the wiring by the photolithography method. That is, a resist film (photosensitive polyimide film) is formed on the flat surface 2a of the transparent substrate 2, the part of the resist film which can be the partition wall 9 is exposed (that is, the part superimposed on the anode electrode 3 is exposed), and a part other than the exposed part of the resist film is eliminated by a developer. As a result, shaping of the resist film is performed so that the remaining part of the resist film becomes the partition wall 9.

Thereafter, a high-molecular material including a luminescent material is solved by a solvent, and the solvent is caused to belch out as droplets to each surrounded area surrounded by the partition wall 9. Then, the droplet spreads on the anode electrode 3 and becomes a film. When this film-is hardened, the organic EL layer 4 is formed.

Subsequently, the cathode electrode 5 is formed by the film forming step such as a vapor deposition method, a sputtering method or a CVD method. Although the number of the cathode electrode 5 shown in FIG. 2 is one, a plurality of the cathode electrodes 5 arranged in the matrix form may be used in some cases. In such a case, after forming the film of a conductive film which can be the cathode electrode, a plurality of cathode electrodes 5 arranged in the matrix shape are formed by performing the masking step such as a photolithography method or the thin film shape manufacturing step such as an etching method.

The reflecting film 8 is formed on the irregular surface 7b of the lens array 7. Then, the optical adhesive 6 is applied to at least one of the cathode electrode 5 on the transparent substrate 2 side and the flat surface 7a of the lens array 7, and the optical adhesive 6 is used to bond the flat-surface 7a of the 2b lens array 7 to the cathode electrode 5. At this moment, positioning is performed in such a manner that each convex lens 7c is superimposed on each cathode electrode 5 when seen from the plane surface, and the lens array 7 is bonded to the cathode electrodes 5. Then, the optical adhesive 6 is hardened, thereby bringing the luminescent panel 1 shown in FIG. 2 to completion.

In the luminescent panel 1 shown in FIG. 1A or FIG. 2, when the forward bias voltage (the potential of the anode electrode 3 is higher than the potential of the cathode electrode 5) is applied between the anode electrode 3 and the cathode electrode 5, the electron holes are injected into the organic EL layer 4 from the anode electrode 3, and the electrons are injected from the cathode electrode 5 into the organic EL layer 4. Then, the electron holes and the electrons are transported to the narrow-sense luminescent layer of the organic EL layer 4, and the electron holes and the electrons are re-coupled in the narrow-sense luminescent layer, thereby generating the excitons. The excitons excite the fluorescent material in the organic EL layer 4 to emit the light. Since the anode electrode 3 and the substrate 2 are transparent with respect to the luminescent wavelength band of the organic EL layer 4, a part of the light emitted in the organic EL layer 4 passes through the anode 3 and the transparent substrate 2, and outgoes from the flat light emitting surface 2b of the transparent substrate 2. Since the cathode electrode 5, the optical adhesive 6 and the lens array 7 are also transparent with respect to the luminescent wavelength band of the organic EL layer 4, the remaining part of the light from the organic EL layer 4 is reflected on the reflecting film 8 through the cathode electrode 5, the optical adhesive 6 and the lens array 7, and the reflected light passes through the lens array 7, the transparent adhesive 6, the cathode electrode 5, the organic EL layer 4, the anode electrode 3 and the transparent substrate 2, and outgoes from the light emitting surface 2b.

In the luminescent panel 1 shown in FIG. 1A or FIG. 2, since the concave mirror faces the cathode electrode 5, the light directed toward the reflecting film 8 from the organic EL layer 4 is reflected so as to be condensed at the central part. That is, the light directed toward the reflecting film 8 from the organic EL layer 4 passes the apex of the convex lens 7c and is reflected so as to be condensed or focused toward the normal line direction of the light emitting surface 2b. Therefore, the luminescent brightness of the luminescent panel 1 is very high when seen from the normal line direction of the light emitting surface 2b. Therefore, the light emitted from the organic EL layer 4 can be prevented from evenly spreading in the radial pattern on the light emitting surface 2b. In particular, when it is used for the matrix display type display like the luminescent panel 1 shown in FIG. 2, since the light emitted from the organic EL layer 4 can be suppressed from spreading in the radial pattern, it is not strongly diffused to surrounding pixels, and display with the high contrast ratio can be realized.

Figure 1B:
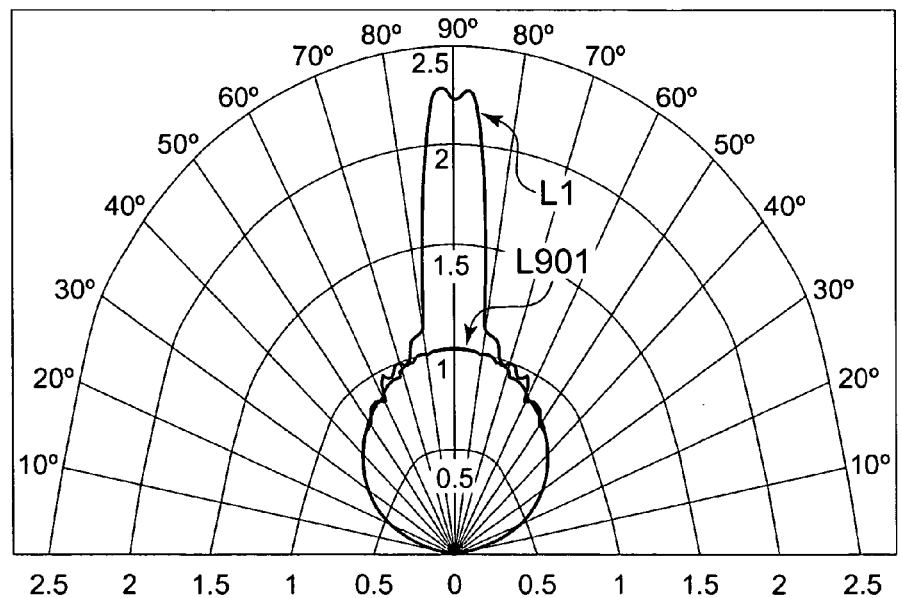
FIG. 1B is a graph showing a luminescent characteristic of this luminescent panel.

A graph of FIG. 1B is a graph showing the directivity of the outgoing light of the luminescent panel 1 shown in FIG. 1A, in which angles of axes radially extending from a starting point O in the light emitting surface 2b represent measured angles with respect to the light emitting surface 2b, and distances from the starting point O represent light intensity ratios (ratios of the brightness [cd/m$^2$]). The transparent substrate 2 is set to have a refraction factor of 1.5 and a thickness of 0.7 mm. It is to be noted that the anode electrode 3, the organic EL layer 4, the cathode electrode 5 and the optical adhesive 6 are very thin as compared with the transparent substrate 2. As refraction factors of these members, it is desirable to adopt refraction factors which do not greatly affect the directivity of the light intensity ratio but are low.

Figure 22:
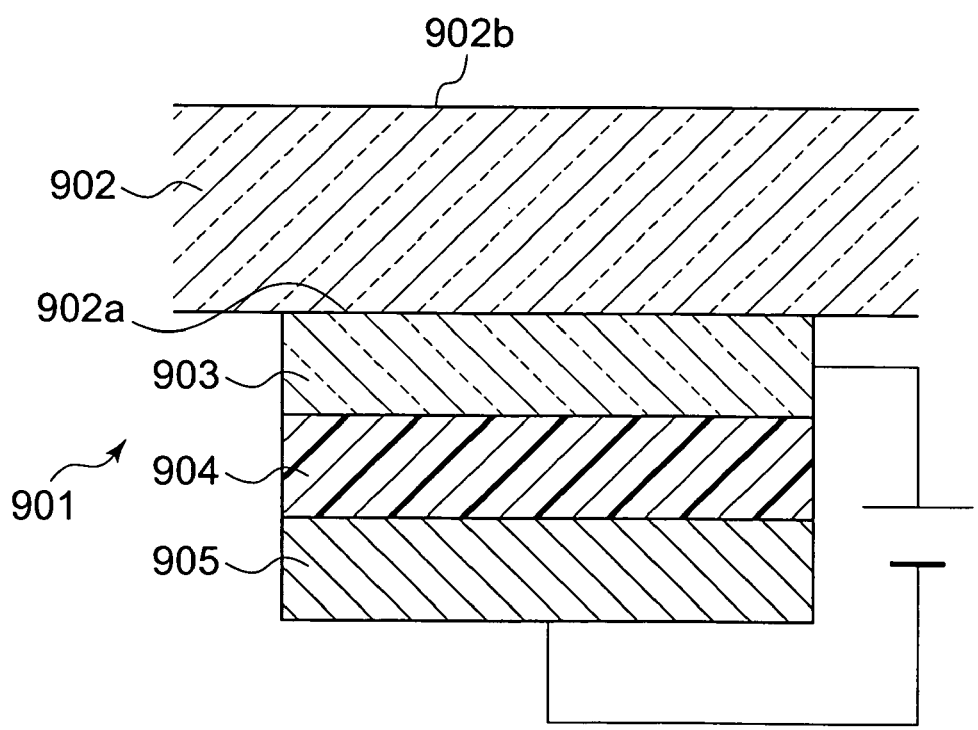
FIG. 22 is a cross-sectional view showing a part of a luminescent panel according to a twenty-first embodiment.

A line L901 represents a light intensity ratio of the luminescent panel 901 of FIG. 22 (where the cathode electrode 905 has the reflectivity with respect to the visible light). Providing that the light intensity ratio is 1 when seen from the normal line direction, the light intensity ratio of any angle is dimensionless.

A line L1 represents a light intensity ratio of the luminescent panel 1 of FIG. 1A, and this is a relative value expressing the light intensity as 1 when viewing the luminescent panel 901 from the normal line direction of the surface 902b as a comparative example.

Various conditions in this embodiment (e.g., a film thickness of each layer, a material of each layer, a level of an application voltage, a luminescent area, a level of a passing current and others) are equal to those in the prior art except that the lens array 7 and the reflecting film 8 are provided.

As shown in FIG. 1B, the brightness in the luminescent panel 1 according to this embodiment is substantially the same as the brightness in the prior art luminescent panel in the angle range of 0° to 60°. However, in case of an angle more than 60°, the brightness in the luminescent panel 1 in this embodiment is higher than the brightness in the prior art luminescent panel. In particular, when the angle is not less than 80°, a difference in brightness is considerable.

As described above, since the luminescent panel 1 includes the concave mirror so as to be opposed to the transparent cathode electrode 5, the emitting efficiency is improved within 30° on the right and left sides with respect to the light emitting surface 2b. In particular, the emitting efficiency within 5° on the right and left sides is improved to be double or more.

In addition, since the concave mirror is provided so as to be opposed to the transparent cathode electrode 5, the brightness when seen from the normal line direction with respect to the light emitting surface 2b becomes high without increasing the current or the voltage of the luminescent panel 1. In other words, since the luminescent brightness becomes high without increasing the level of the current flowing through the luminescent panel 1, the long duration of life and the low power consumption of the luminescent panel 1 can be realized, thereby improving the light emitting efficiency of the luminescent panel 1.

When this luminescent panel 1 is used as the display panel of the display, the brightness when seen from the normal line direction relative to the light emitting surface 2b is high, thereby providing the display with the high contrast.

By appropriately changing the shape of the lens array, the shape of the concave mirror can be appropriately varied as shown in FIGS. 3A, 4A, 5A, 6A, 7A and 8A. In the luminescent panels 10 to 15 shown in FIGS. 3A, 4A, 5A, 6A, 7A and 8A described below, like reference numerals denote constituent elements equal to those in the luminescent panel 1. In these embodiments, the anode electrodes 3 are separated from each other in the row direction by a plurality of protrusions which are provided on one surface of the organic EL layer 4 so as to protrude at predetermined intervals in the row direction and extend in the column direction, and the cathode electrodes 5 are separated from each other in the line direction by a plurality of protrusions (not shown in the drawing) which are provided on the other surface so as to protrude with predetermined intervals in the column direction and extend in the row direction. In this manner, the separated anode electrode sections or first strip electrodes cross the separated cathode electrode sections or second strip electrodes at many points, and these parts and the parts of the organic EL layer sandwiched therebetween constitute pixels.

Figure 3A:
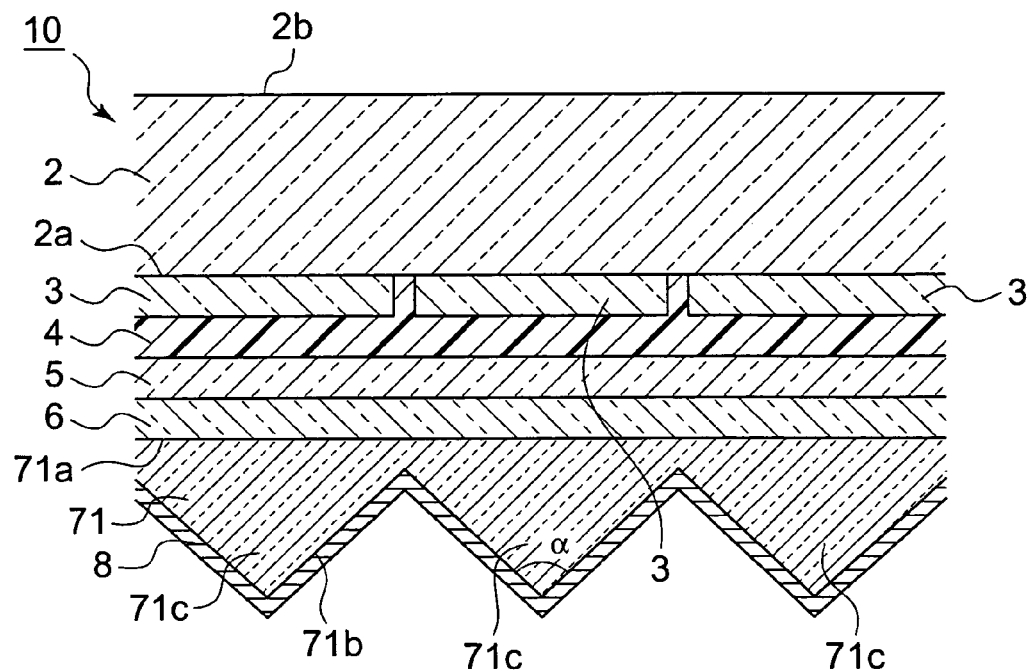
FIG. 3A is a cross-sectional view showing a part of a luminescent panel according to a second embodiment.
Figure 3B:
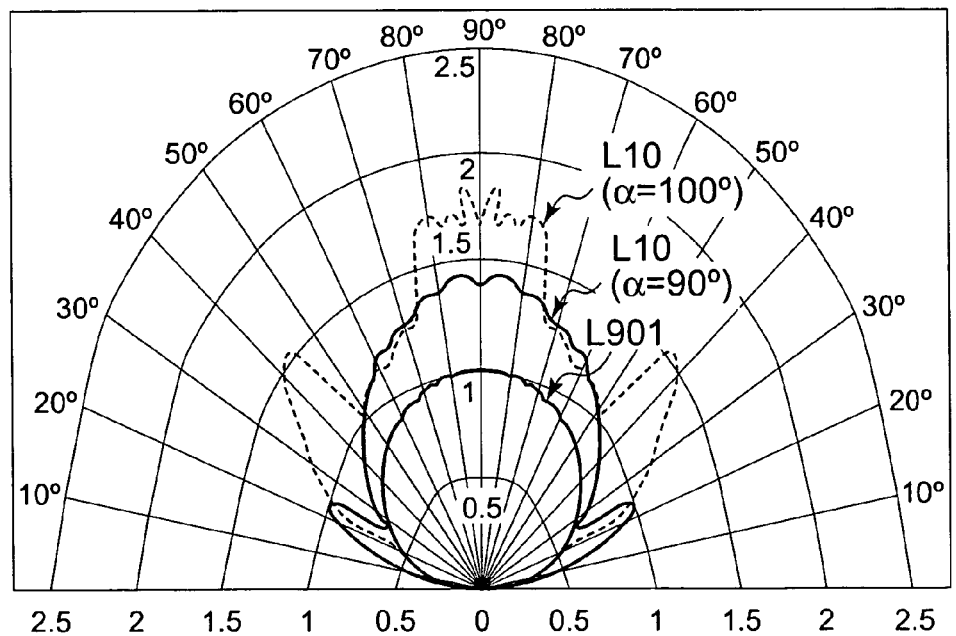
FIG. 3B is a graph showing a luminescent characteristic of this luminescent panel.

In the luminescent panel 10 shown in FIG. 3A, as to the shape of the lens array 71, its surface 71a bonded to the cathode electrode 5 is a flat surface. Irregular surface 71b on the opposite side has a shape that a plurality of convex lenses 71c are arranged in the matrix shape when seen from the plane surface. The convex lens 71c has a substantially circular cone shape. Forming the film of a reflecting film 8 on the irregular surface 71b forms concave mirrors consisting of the convex lenses 71c and the reflecting film 8. Additionally, two opposite side lines which are in contact with an apex angle α are set to the same length. In FIG. 3B, a line L10 represents a light intensity ratio of the luminescent panel 10 shown in FIG. 3A, and this is expressed as a relative value representing the light intensity as 1 when viewing the luminescent panel 901 from the normal line direction of the surface 902b. Here, there are illustrated cases where the apex angles α of the convex lens 71c are 90° and 100°. In any case, this panel is brighter over 180° than the luminescent panel 901. In particular,.the brightness when seen from the normal line direction relative to the light emitting surface 2b is greatly high as compared with the prior art, and this tendency is more prominent when the apex angle α is 100° rather than 90°.

Figure 4A:
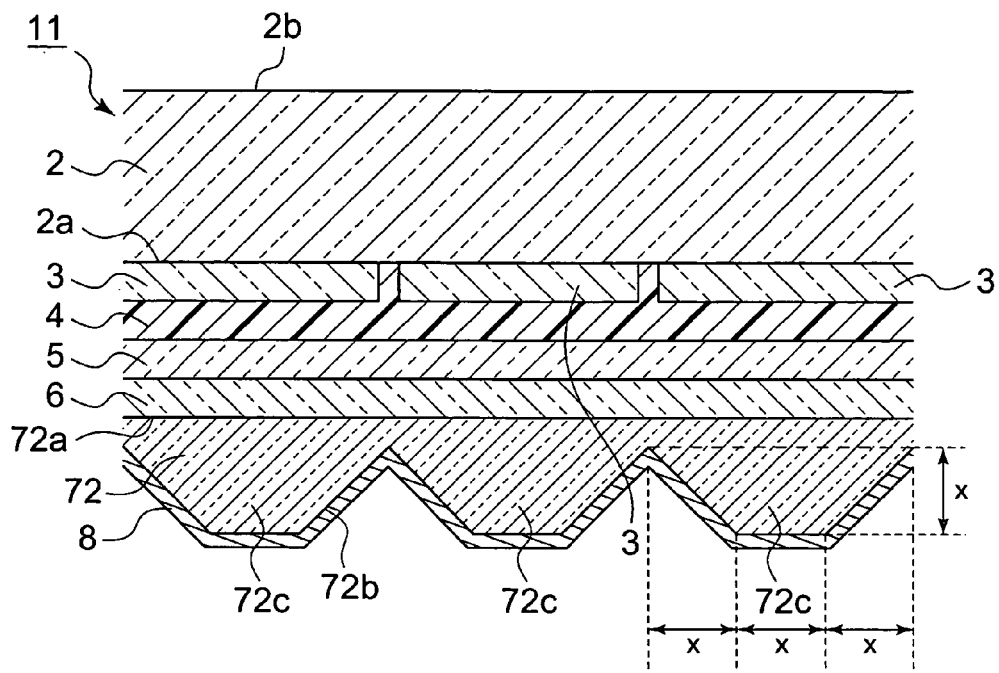
FIG. 4A is a cross-sectional view showing a part of a luminescent panel according to a third embodiment.
Figure 4B:
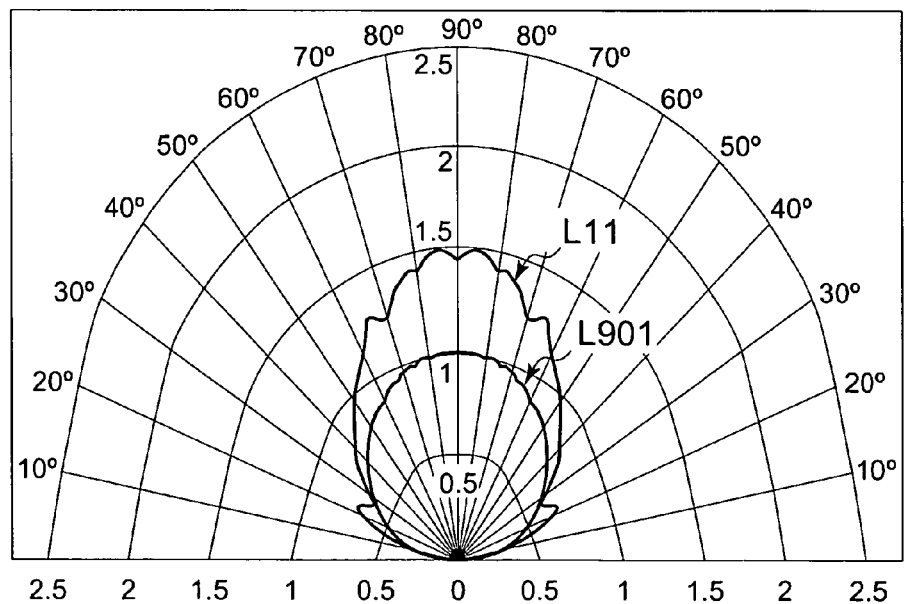
FIG. 4B is a graph showing a luminescent characteristic of this luminescent panel.

In the luminescent panel 11 shown in FIG. 4A, as to the shape of the lens array 72, its surface 72a bonded to the cathode electrode 5 is a flat surface. An irregular surface 72b on the opposite side has a shape that a plurality of convex lenses 72c are arranged in the matrix shape when seen from the plane surface. The convex lens 72c has a truncated cone shape, and a ratio of a height x from a valley of the truncated cone to a small upper surface and a diameter x of the small upper surface is 1:1 whilst a ratio of a diameter 3x of a large bottom surface of the truncated cone (distance between valleys) and a width x of the small upper surface is 3:1. The reflecting film 8 is formed on the irregular surface 72b, so that concave mirrors consisting of the convex lenses 72c and the reflecting film 8 are formed. In FIG. 4B, a line L11 represents a light intensity ratio of the luminescent panel 11 of FIG. 4A, and this is expressed as a relative value representing the light intensity as 1 when viewing the luminescent panel 901 from the normal line direction of the surface 902b as a comparative example. The luminescent panel 11 is brighter over approximately 180° than the luminescent panel 901. In particular, it demonstrates the brightness equal to or above the front face brightness of he luminescent panel 901 over approximately 40° on the right and left sides relative to the normal line direction of the light emitting surface 2b.

Figure 5A:
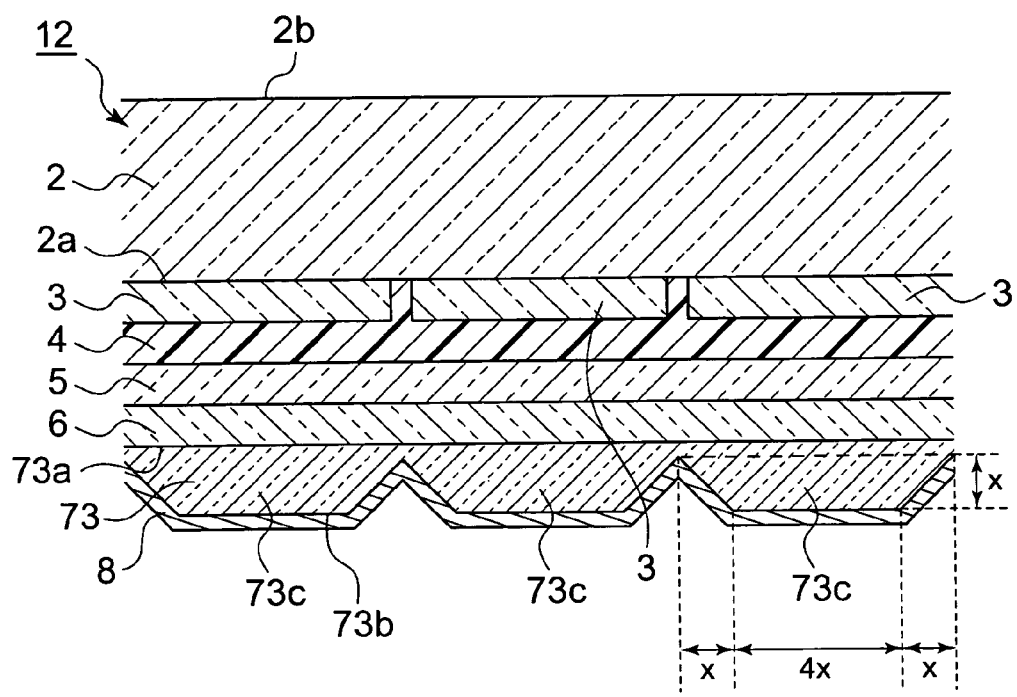
FIG. 5A is a cross-sectional view showing a part of a luminescent panel according to a fourth embodiment.
Figure 5B:
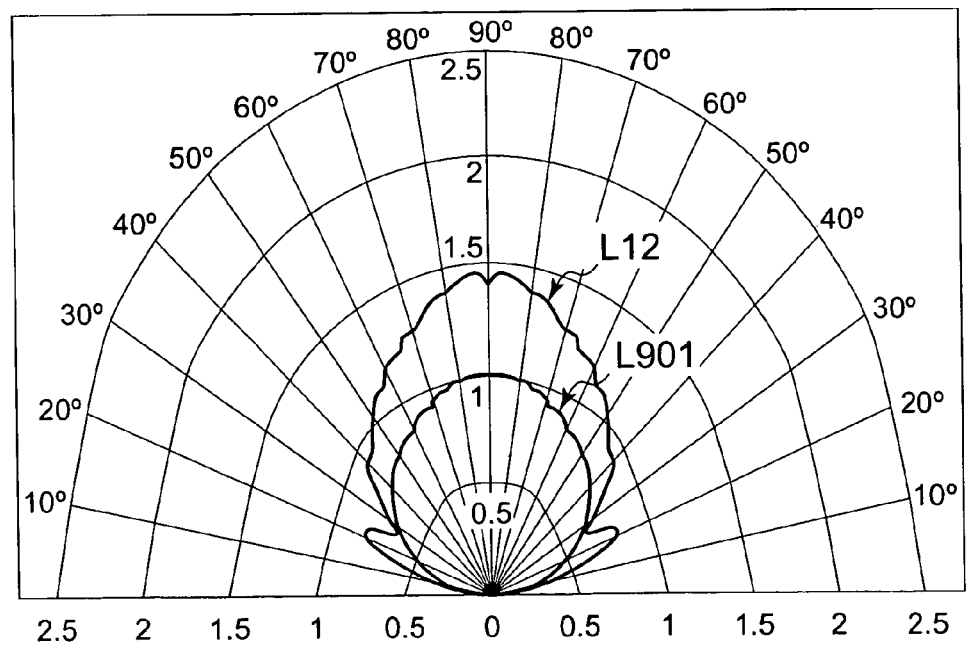
FIG. 5B is a graph showing a luminescent characteristic of this luminescent panel.

In the luminescent panel 12 shown in FIG. 5A, as to the shape of the lens array 73, its surface 73a bonded to the cathode electrode 5 is a flat surface. Its irregular surface 73b on the opposite side has a shape that a plurality of convex lenses 73c are arranged in the matrix from when seen from the plane surface. The convex lens 73c has a truncated cone shape, and a ratio of a height x of the truncated cone and a diameter 4x of a small upper surface is 1:4 whilst a ratio of a diameter 6x of a large bottom surface of the truncated cone and a width 4x of the small upper surface is 6:4. Forming the reflecting film 8 on the irregular surface 73b constitutes a concave mirrors consisting of the convex lenses 73c and the reflecting film 8. In FIG. 5B, a line L12 represents a light intensity ratio of the luminescent panel 12 shown in FIG. 5A, and this is expressed as a relative value representing the light intensity as 1 when viewing the luminescent panel 901 from the normal line direction of the surface 902b as a comparative example. The luminescent panel 12 is brighter over approximately 180° than the luminescent panel 901. In particular, it demonstrates the brightness equal to or above the front face brightness of the luminescent panel 901 over approximately 40° on the right and left sides with respect to the normal line direction of the light emitting surface 2b.

Figure 6A:
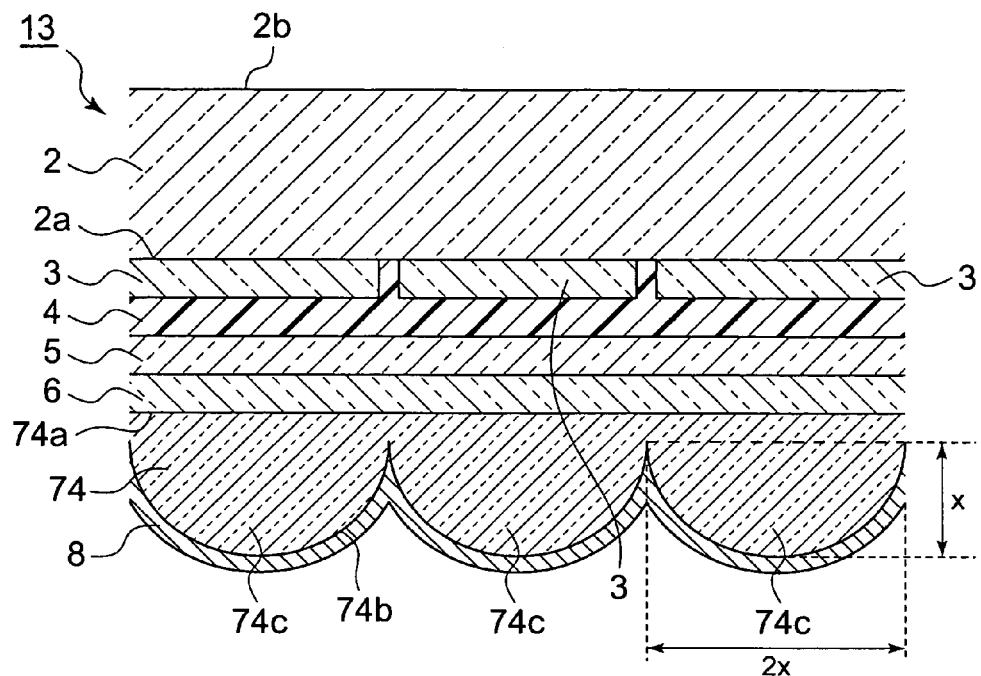
FIG. 6A is a cross-sectional view showing a part of a luminescent panel according to a fifth embodiment.
Figure 6B:
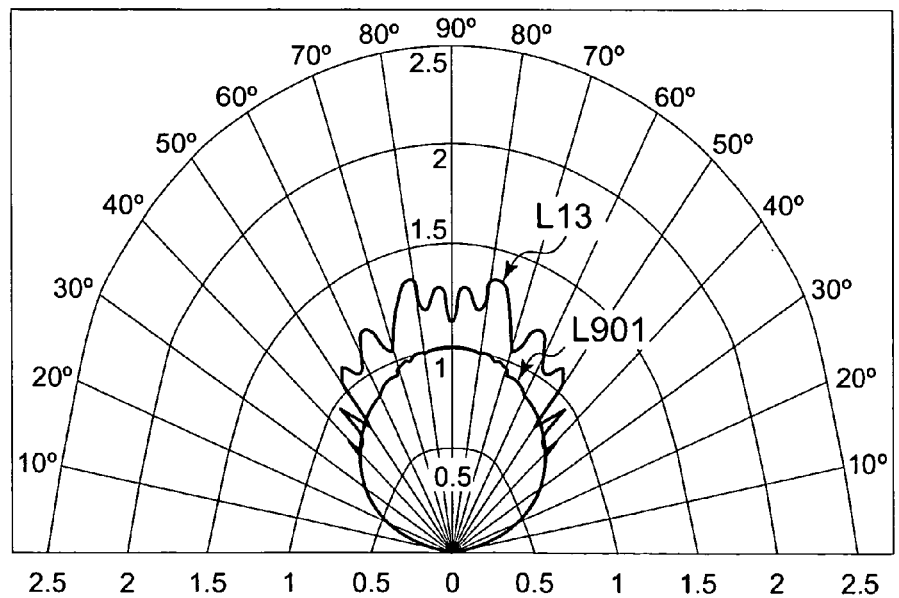
FIG. 6B is a graph showing a luminescent characteristic of this luminescent panel.

In the luminescent panel 13 shown in FIG. 6A, as to the shape of the lens array 74, its surface 74a bonded to the cathode electrode 5 is a flat surface. Its irregular surface 74b on the opposite side has a shape that a plurality of convex lenses 74c are arranged in the matrix form when seen from the flat surface. The convex lens 74c has a curved surface and a semispherical shape that a height of the convex portion is x with respect to a distance $2x$ between concave portions of the convex lens 74c. The reflecting film 8 is formed on the irregular surface 74b, so that concave mirrors consisting of the convex lenses 74c and the reflecting film 8 are formed. In FIG. 6B, a line L13 represents a light intensity of the luminescent panel 13 shown in FIG. 6A, and this is expressed as a relative value representing the light intensity as 1 when viewing the luminescent panel 901 from the normal line direction of the surface 902b. The luminescent panel 13 is brighter than the luminescent panel 901 over approximately 40° on the right and left sides of the normal line direction of the light emitting surface 2b.

Figure 7A:
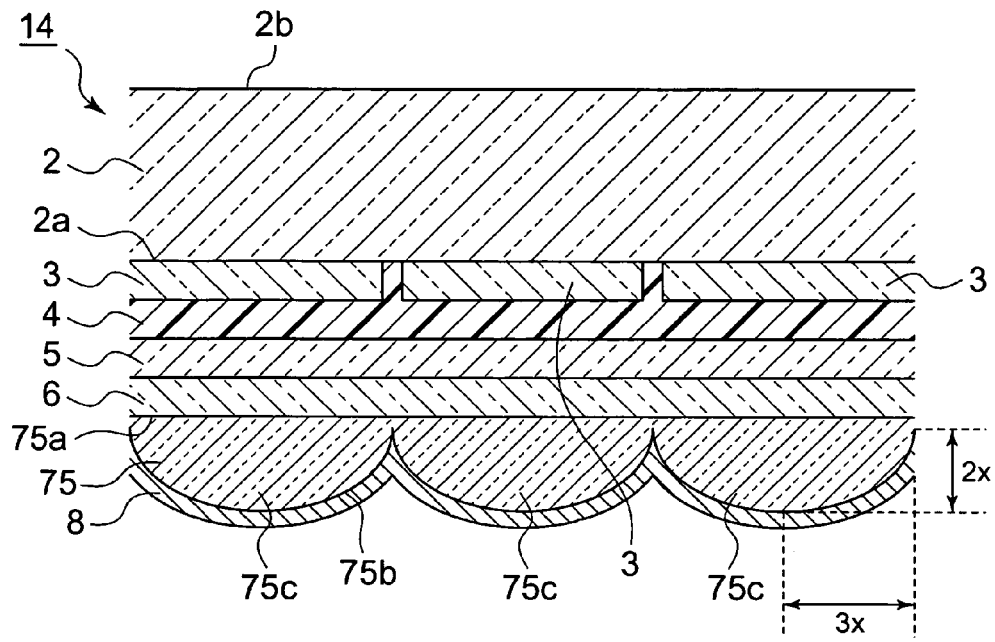
FIG. 7A is a cross-sectional view showing a part of a luminescent panel according to a sixth embodiment.
Figure 7B:
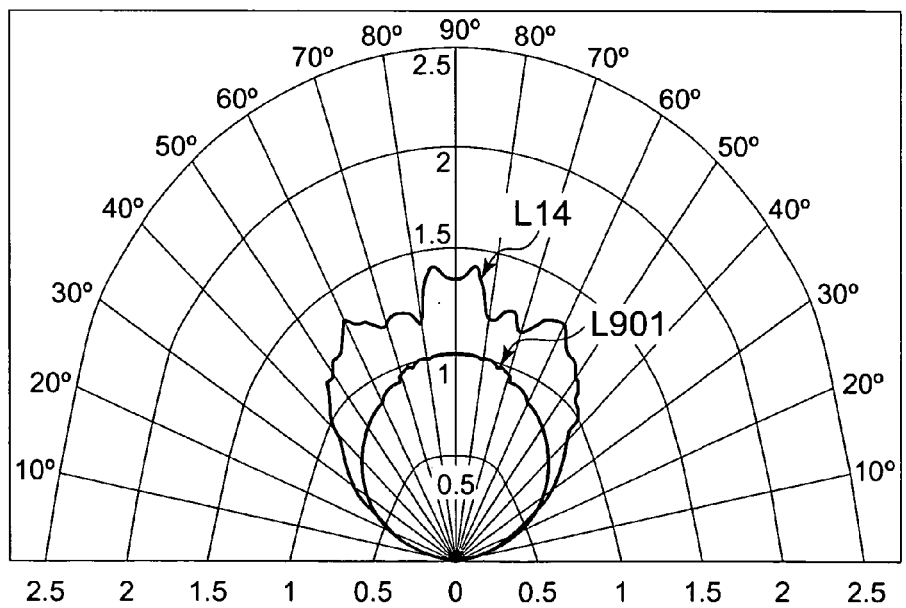
FIG. 7B is a graph showing a luminescent characteristic of this luminescent panel.

In the luminescent panel 14 shown in FIG. 7A, as to the shape of the lens array 75, its surface 75a bonded to the cathode electrode 5 is a flat surface. Its irregular surface 75b on the opposite side has a shape that a plurality of convex lenses 75c are arranged in the matrix form when seen from the plane surface. A cross-sectional shape of the convex lens 75c is semioval, and a ratio of the major axis $3x$ (width of the bottom surface) and the minor axis $2x$ (height) is 3:2. The reflecting film 8 is formed on the irregular surface 75b, so that a non-spherical concave mirrors consisting of the convex lenses 75c and the reflecting film 8 are formed. In FIG. 7B, a line L14 represents a light intensity ratio of the luminescent panel 14 shown in FIG. 7A, and this is expressed as a relative value representing the light intensity as 1 when viewing the luminescent panel 901 from the normal line direction of the surface 902b as a comparative example. The luminescent panel 14 is brighter than the luminescent panel 901 over approximately 60° on the right and left sides with respect to the normal line direction of the light emitting surface 2b.

Figure 8A:
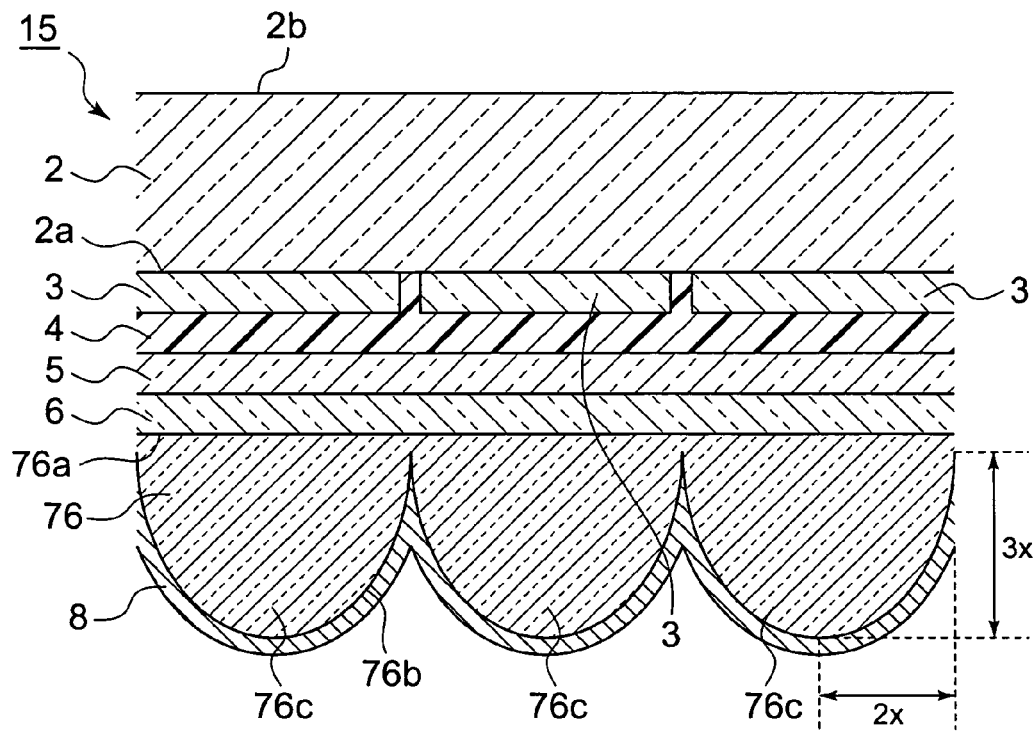
FIG. 8A is a cross-sectional view showing a part of a luminescent panel according to a seventh embodiment.
Figure 8B:
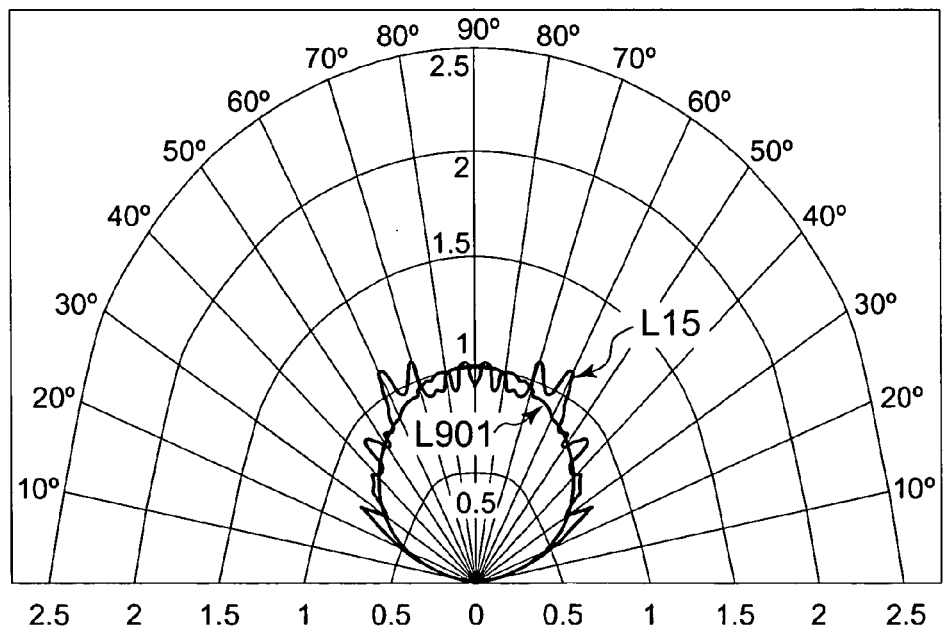
FIG. 8B is a graph showing a luminescent characteristic of this luminescent panel.

In the luminescent panel 15 of FIG. 8A, as to the shape of a lens array 76, its surface 76a bonded to the cathode electrode 5 is a flat surface. Its irregular surface 76b on the opposite side has a shape that a plurality of convex lenses 76c are arranged in the matrix form when seen from the plane surface. A cross-sectional shape of the convex lens 76c is semioval, and a ratio of the minor axis (width of the bottom surface) and the major axis (height) is 2:3. The reflecting film 8 is formed on the irregular surface 76b, so that non-spherical concave mirrors consisting of the convex lenses 76c and the reflecting film 8 are formed. In FIG. 8B, a line L15 represents a light intensity of the luminescent panel 15 shown in FIG. 8A, and this is expressed as a relative value representing the light intensity as 1 when viewing the luminescent panel 901 from the normal line direction of the surface 902b as a comparative example. The luminescent panel 15 is brighter than the luminescent panel 901 over approximately 20° to 35° on the right and left sides with respect to the normal line direction of the light emitting surface 2b.

In FIGS. 3A, 4A, 5A, 6A, 7A and 8A, the anode electrode 3, the organic EL layer 4 and the cathode electrode 5 may be partitioned by partition walls 9 in the matrix form seen from the plane surface as shown in FIG. 2. In this case, one concave mirror constituted by one of the convex lenses 71c to 76c and the part of the reflecting film 8 faces one partitioned area (the anode electrode 3, the organic EL layer 4 and the cathode electrode 5 are superimposed in this area).

In the luminescent panels 1, 10 to 12 shown in FIGS. 1A, 2, 3A, 4A and 5A, a translucent lens array may be provided on one surface of the transparent substrate 2.

Figure 9A:
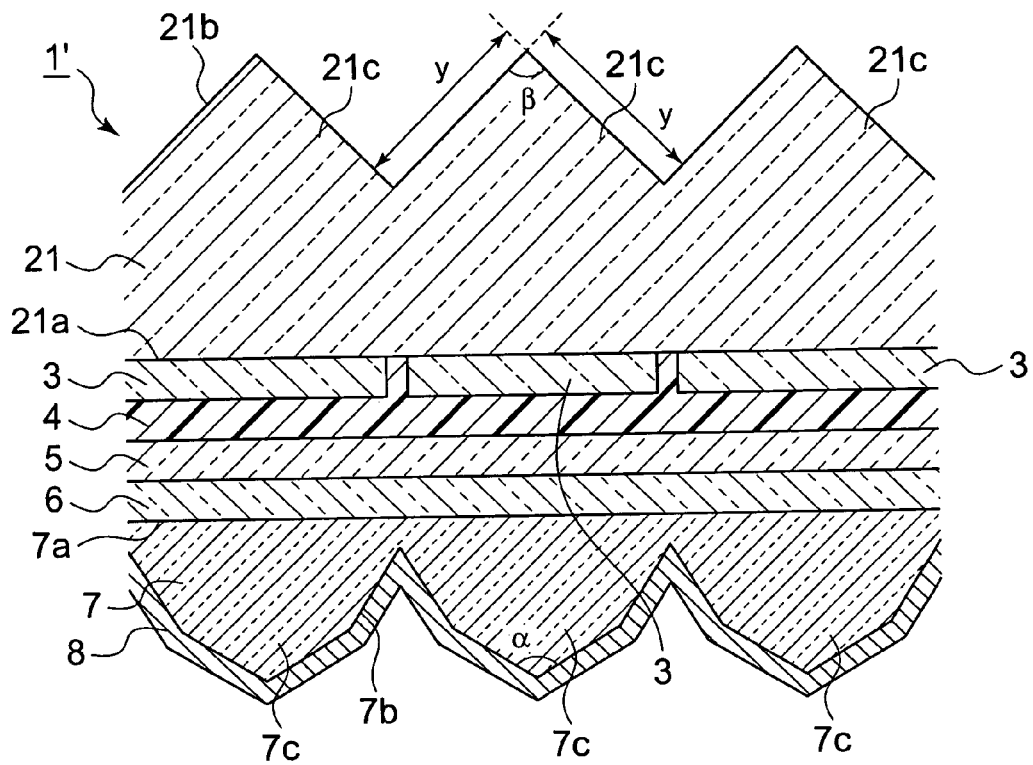
FIG. 9A is a cross-sectional view showing a part of a luminescent panel of an eighth embodiment.
Figure 9B:
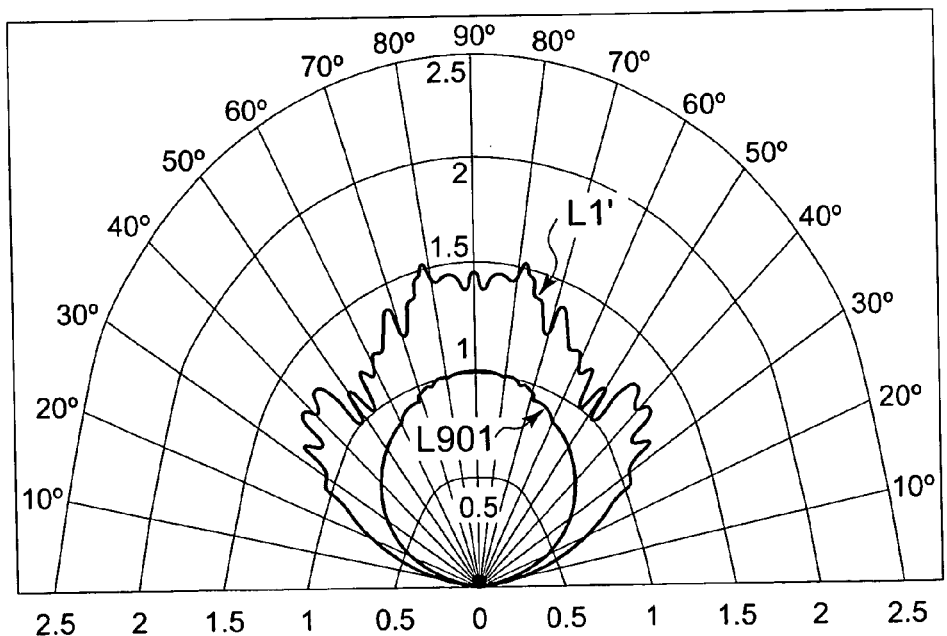
FIG. 9B is a graph showing a luminescent characteristic of this luminescent panel.

FIG. 9A shows a luminescent panel 1' in which the transparent substrate 2 of the luminescent panel 1 shown in FIG. 1A is substituted by a transparent lens array substrate 21. The anode electrode 3, the organic EL layer 4 and the cathode electrode 5 are sequentially superimposed on the flat surface 21a of the lens array substrate 21. A corrugated surface 21b of the lens array substrate 21 is a light emitting surface, and a plurality of convex lenses 21c are arranged in the matrix form. The convex lens 21c has a circular cone shape that two opposite side lines which are in contact with an apex angle β in a cross section along an apex have the same length y. When seen from the plane surface, each convex lens 21c is superimposed on the convex lens 7c in such a manner that an apex of each convex lens 21c is opposed to the apex of the convex lens 7c. In FIG. 9B, a light L1' represents a light intensity ratio of the luminescent panel 1' in FIG. 9A, and this is expressed as a relative value representing the light intensity as 1 when viewing the luminescent panel 901 from the normal line direction of the surface 902b as a comparative example. The luminescent panel 1' is brighter than the luminescent panel 901 over approximately 180°. In particular, it demonstrates the brightness equal to or above the front face brightness of the luminescent panel 901 over approximately 60° on the right and left sides from the front face direction of the lens-array substrate 21.

Figure 10A:
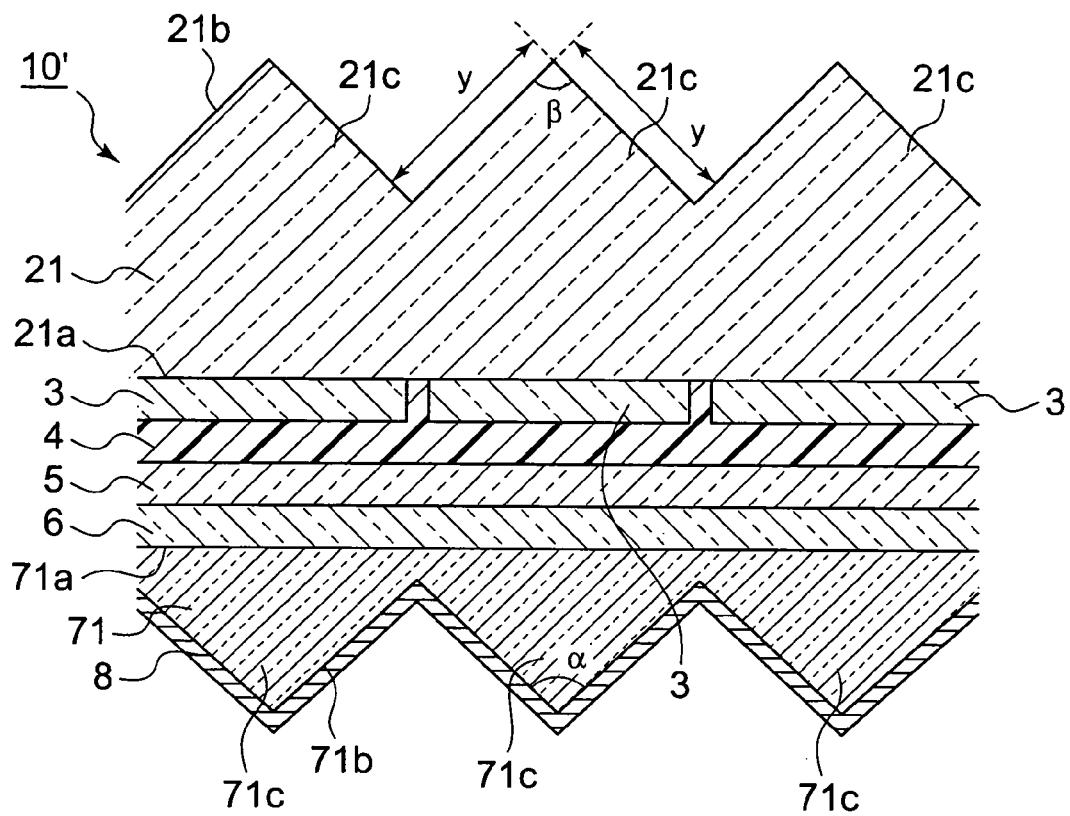
FIG. 10A is a cross-sectional view showing a part of a luminescent panel of a ninth embodiment.
Figure 10B:
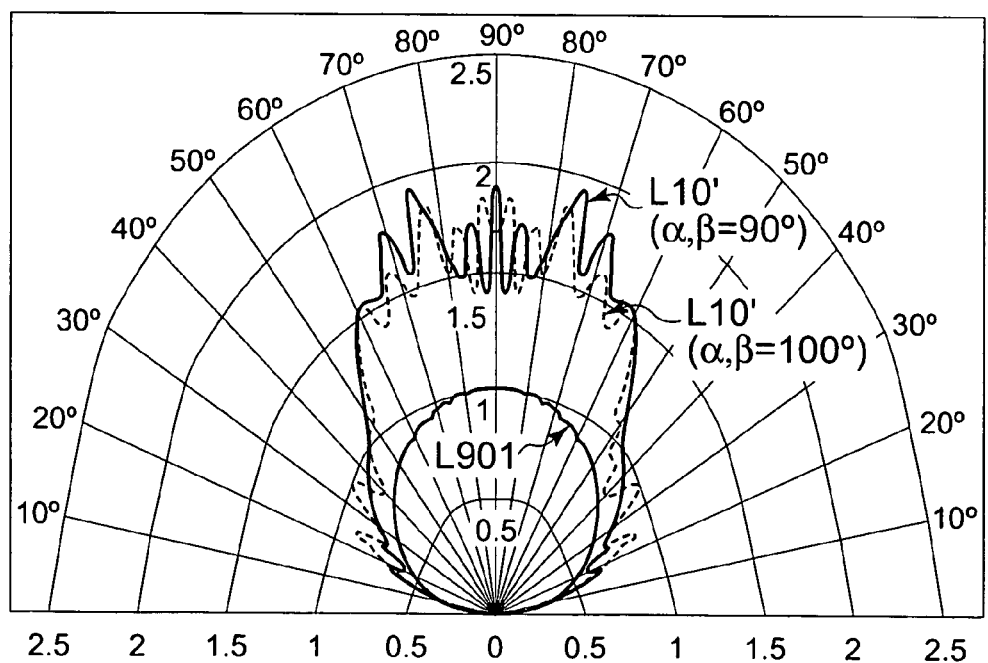
FIG. 10B is a graph showing a luminescent characteristic of this luminescent panel.

FIG. 10A shows a luminescent panel 10' in which the transparent substrate 2 of the luminescent panel 10 shown in FIG. 3A is substituted by a lens array substrate 21. The anode electrode 3, the organic EL layer 4 and the cathode electrode 5 are sequentially laminated on the flat surface 21a of the lens array substrate 21. The corrugated surface 21b of the lens array substrate 21 is a light emitting surface, and a plurality of convex lenses 21c are arranged in the matrix form. The convex lens 21c has the same circular cone shape as that shown in FIG. 9A. Further, each convex lens 21c is superimposed on the convex lens 71c in such a manner that the apex of each convex lens 21c is opposed to the apex of the convex lens 71c when seen from the plane surface. In FIG. 10B, a line L10' represents a light intensity ratio of the luminescent panel 10' shown in FIG. 10A, and this is expressed as a relative value representing the light intensity as 1 when viewing the luminescent panel 901 from the normal line direction of the surface 902b as a comparative example. Here, there are illustrated a case that an apex angle β of the convex lens 21c and an apex angle α of the convex lens 71c are 900 and a case that the apex angle β of the convex lens 21c and the apex angle α of the convex lens 71c are 1000. The luminescent panel 10' is brighter than the luminescent panel 901 over approximately 180° even if the both apex angles α and β are 90° or 100°. In particular, it demonstrates the brightness equal to or above the front face brightness of the luminescent panel 901 over approximately 40° on the right and left sides from the front face direction of the lens array substrate 21.

Figure 11A:
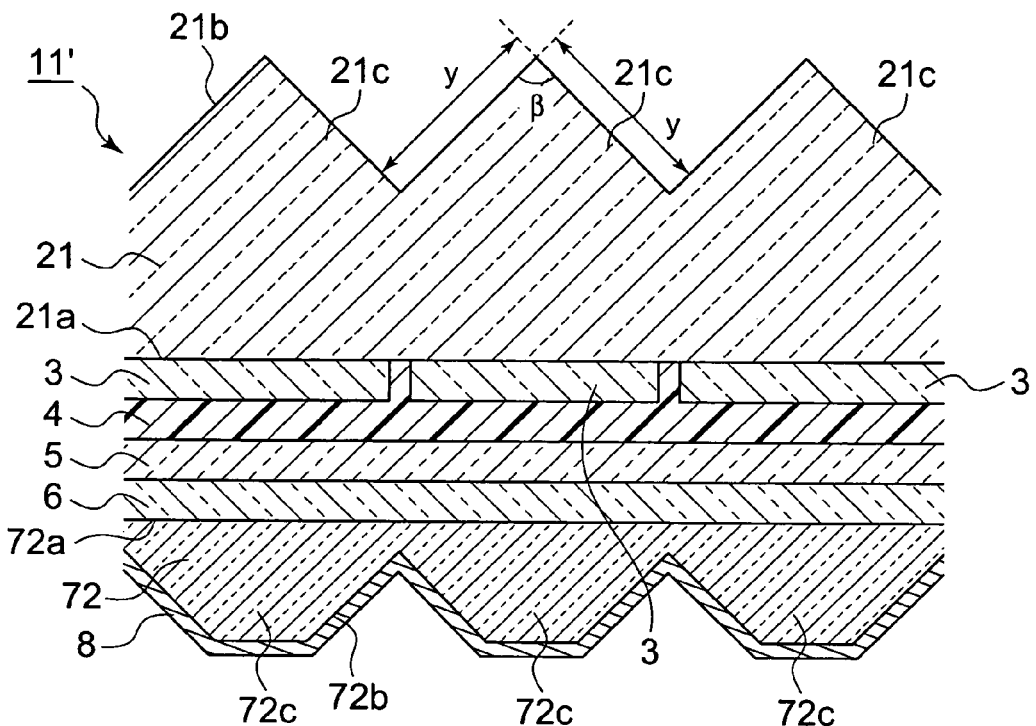
FIG. 11A is a cross-sectional view showing a part of a luminescent panel according to a tenth embodiment.
Figure 11B:
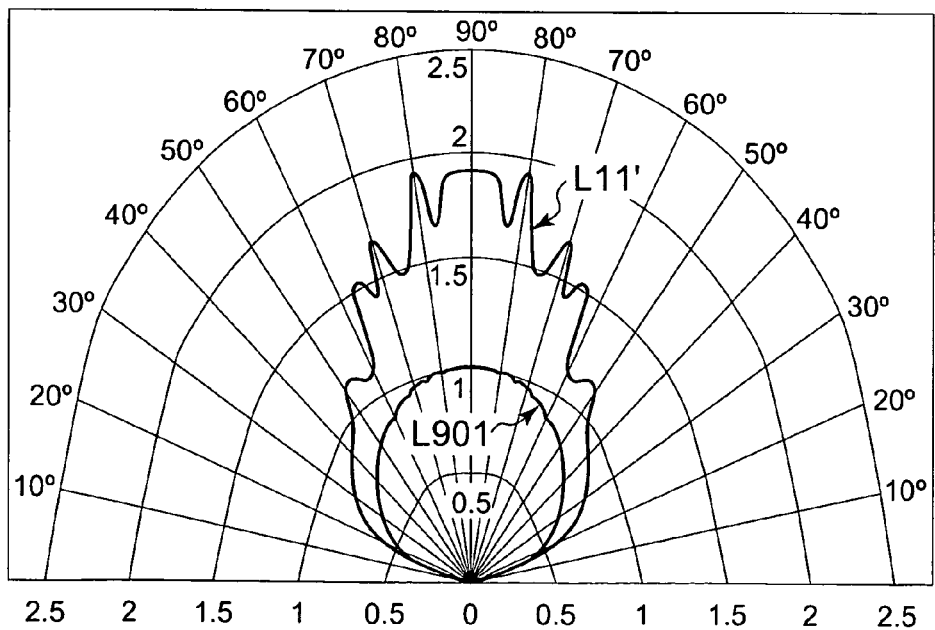
FIG. 11B is a graph showing a luminescent characteristic of this luminescent panel.

FIG. 11A illustrates a luminescent panel 11' in which the transparent substrate 2 of the luminescent panel 11 shown in FIG. 4A is substituted by the lens array substrate 21. The anode electrode 3, the organic EL layer 4 and the cathode electrode 5 are sequentially laminated on the flat surface 21a of the lens array substrate 21. The corrugated surface 21b of the lens array substrate 21 is a light emitting surface, and a plurality of convex lenses 21c are arranged in the matrix form. The convex lens 21c has the same circular cone shape as that shown in FIG. 9A. Furthermore, each convex lens 21c is superimposed on the convex lens 72c in such a manner that the apex of each convex lens 21c is opposed to the small bottom surface of the truncated cone of the convex lens 72c when seen from the plane surface. In FIG. 11B, a line L11' represents a light intensity ratio of the luminescent panel 11' illustrated in FIG. 11A, and this is expressed as a relative value representing the light intensity as 1 when viewing the luminescent panel 901 from the normal line direction of the surface 902b as a comparative example. Here, there is illustrated a case that the apex angle β of the convex lens 21c is 100°. The luminescent panel 11' is brighter than the luminescent panel 901 over approximately 180°. In particular, it demonstrates the brightness equal to or above the front face brightness of the luminescent panel 901 over approximately 45° on the right and left sides from the front face direction of the lens array substrate 21.

Figure 12A:
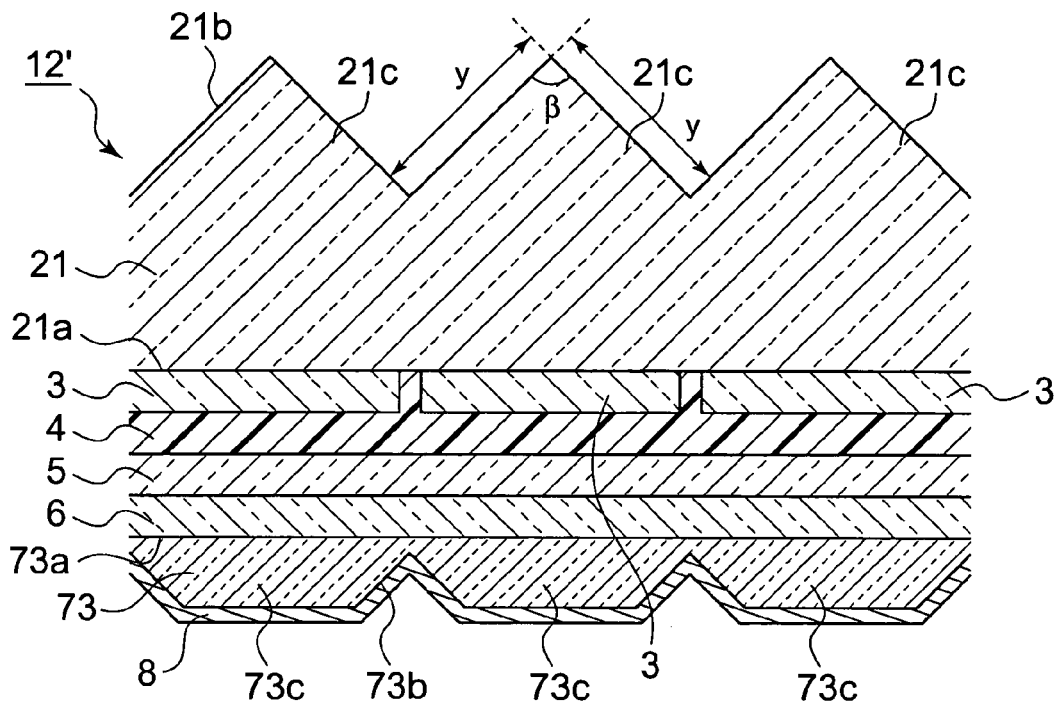
FIG. 12A is a cross-sectional view showing a part of a luminescent panel according to an eleventh embodiment.
Figure 12B:
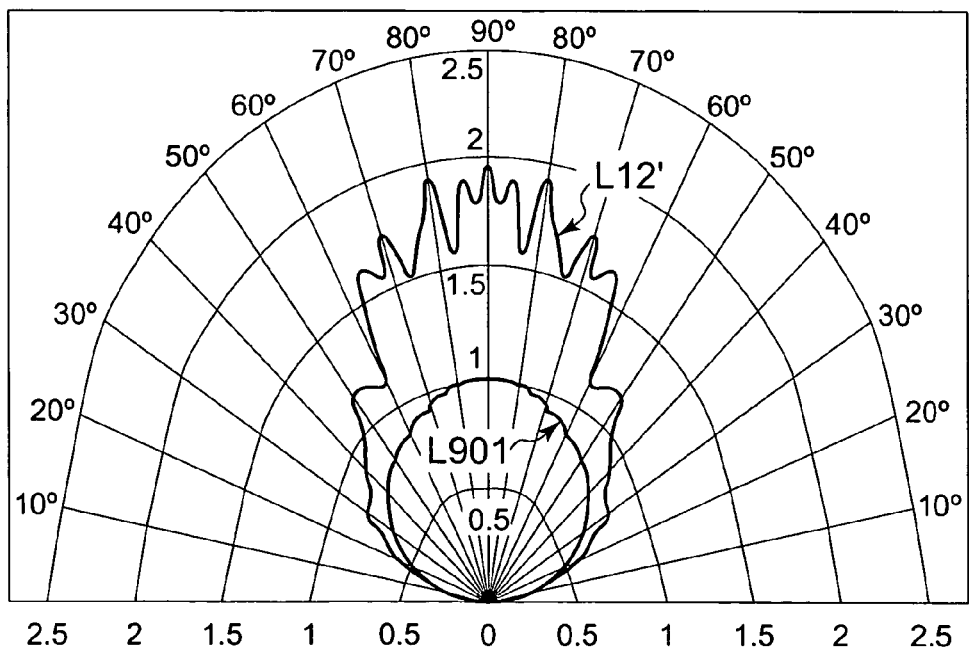
FIG. 12B is a graph showing a luminescent characteristic of this luminescent panel.

FIG. 12A shows a luminescent panel 12' in which the transparent substrate 2 of the luminescent panel 12 depicted in FIG. 5A is substituted by a lens array substrate 21. The anode electrode 3, the organic EL layer 4 and the cathode electrode 5 are sequentially laminated on the flat surface 21a of the lens array substrate 21. On the other hand, the corrugated surface 21b of the lens array substrate 21 is a light emitting surface, and a plurality of convex lenses 21c are arranged in the matrix form. The convex lens 21c has a circular cone shape. Moreover, each convex lens 21c is superimposed on the convex lens 73c in such a manner that the apex of each convex lens 21c is opposed to a small bottom surface of the truncated cone of the convex lens 73c when seen from the plane surface. In FIG. 12B, a line L12' represents a light intensity ratio of the luminescent panel 12' shown in FIG. 12A, and this is expressed as a relative value representing the light intensity as 1 when viewing the luminescent panel 901 from the normal line direction of the surface 902b. Here, there is illustrated a case that the apex angle β of the convex lens 21c is 100°. The luminescent panel 12' is brighter than the luminescent panel 901 over approximately 180°. In particular, it demonstrates the brightness equal to or above the front face brightness of the luminescent panel 901 over approximately 45° on the right and left sides from the front face direction of the lens array substrate 21.

Figure 13A:
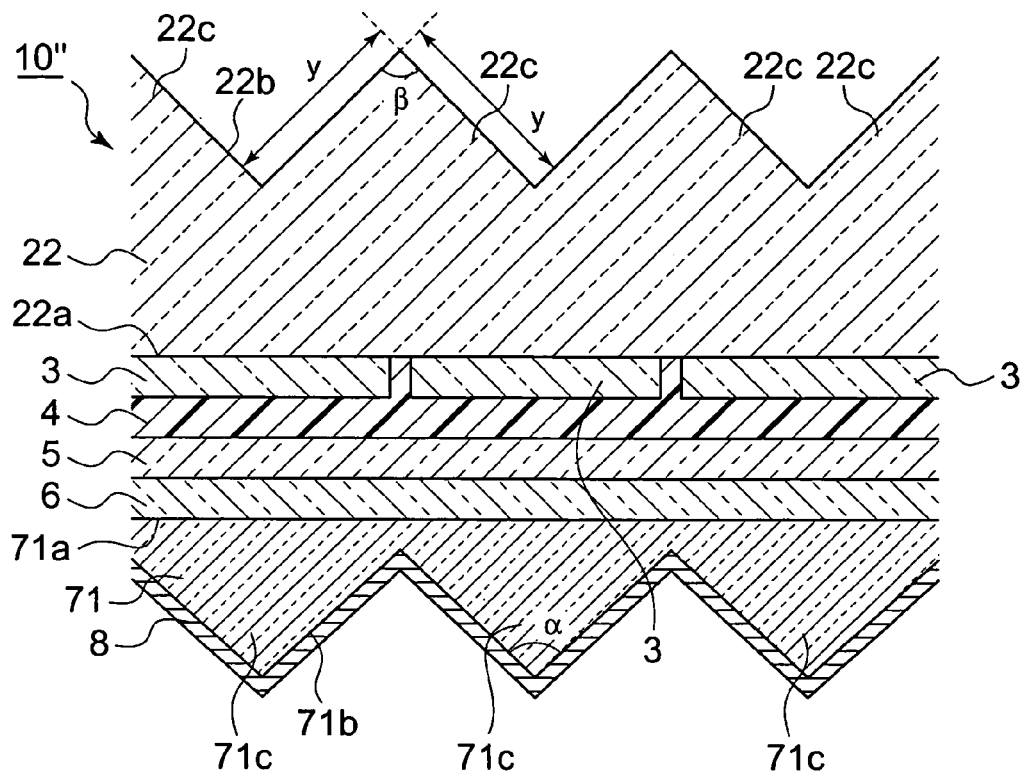
FIG. 13A is a cross-sectional view showing a part of a luminescent panel according to a twelfth embodiment.
Figure 13B:
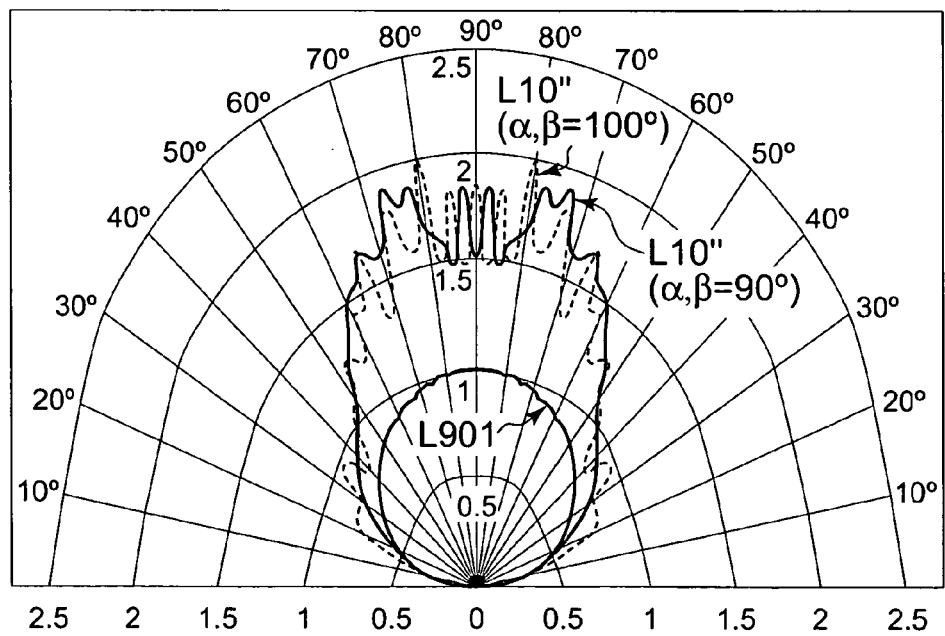
FIG. 13B is a graph showing a luminescent characteristic of this luminescent panel.

FIG. 13A shows a luminescent panel 10" in which the transparent substrate 2 of the luminescent panel 10 depicted in FIG. 3A is substituted by the lens array 22. The anode electrode 3, the organic EL layer 4 and the cathode electrode 5 are sequentially superimposed on the flat surface 22a of the lens array 22. The corrugated surface 22b of the lens array 22 is a light emitting surface, and a plurality of convex lenses 22c arranged in the matrix form are formed by the corrugated surface 22b. The convex lens 22c has a circular cone shape. In addition, the convex lens 22c is shifted from the convex lens 71c by a half pitch in column and row directions. That is, the apex of each convex lens 22c is opposed to a valley between the convex lenses 71c and each valley between the convex lenses 22c is opposed to the apex of the convex lens 71c when seen from the plane surface. In FIG. 13B, a line L10" represents a light intensity ratio of the luminescent panel 10" depicted in FIG. 13A, and this is expressed as a relative value representing the light intensity as 1 when viewing the luminescent panel 901 from the normal line direction of the surface 902b. Here, there are illustrated a case that the apex angle β of the convex lens 22c and the apex angle α of the convex lens 71c are 90° and a case that the apex angle β of the convex lens 21c and the apex angle α of the convex lens 71c are 100°. The luminescent panel 10" is brighter than the luminescent panel 901 over approximately 180° even if the both apex angles α and β are 90° or 100°. In particular, it demonstrates the brightness equal to or above the front face brightness of the luminescent panel 901 over approximately 45° on the right and left sides from the front face direction of the lens array 22.

Figure 14A:
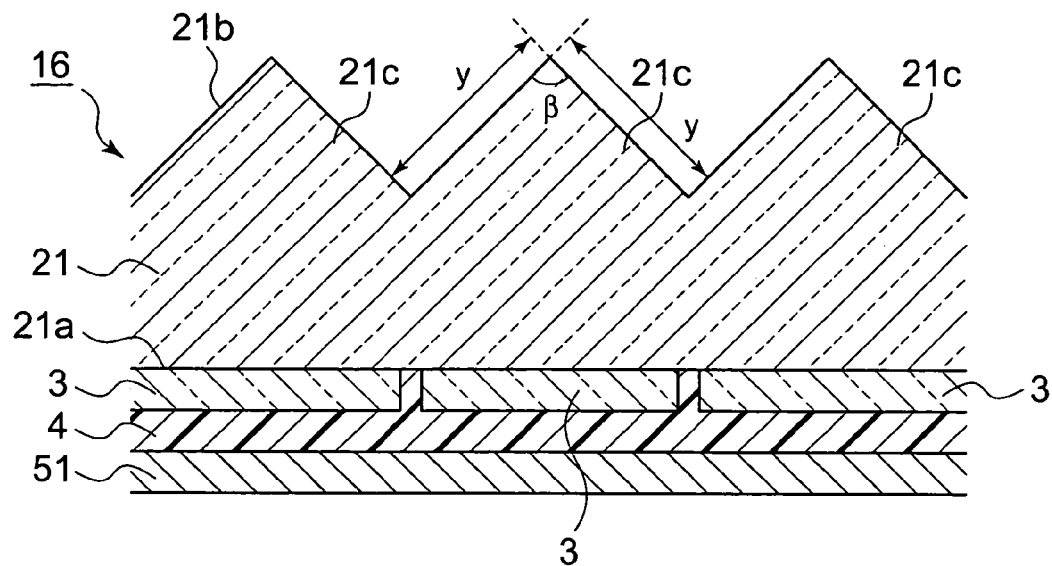
FIG. 14A is a cross-sectional view showing a part of a luminescent panel according to a thirteenth embodiment.

Although the lens array may not be bonded to the cathode electrode 5, the lens array must be used rather than the transparent substrate in this case. FIG. 14A shows an example of such a luminescent panel 16.

Figure 14B:
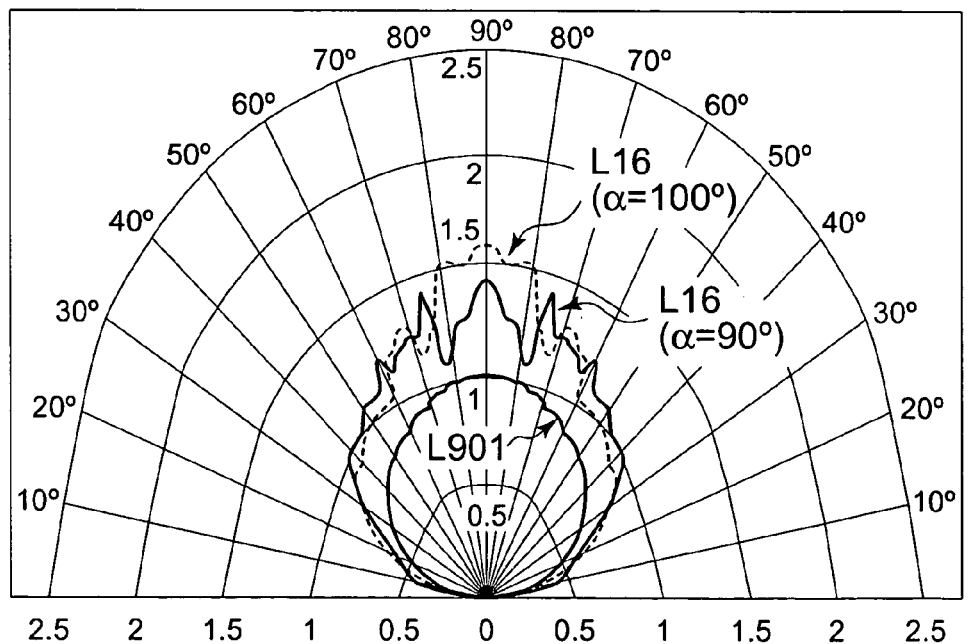
FIG. 14B is a graph showing a luminescent characteristic of this luminescent panel.

As shown in FIG. 14A, the anode electrode 3, the organic EL layer 4 and the cathode electrode 51 are sequentially superimposed on the flat surface 21a of the lens array substrate 21. This cathode electrode 51 is different from the cathode electrode 5 in that it does not have the transmissivity with respect to the visible light but has the reflectivity. Therefore, the cathode electrode 5 acts with the mirror surface. On the other hand, the corrugated surface 21b of the lens array substrate 21 is a light emitting surface, and the convex lenses 21c are arranged in the matrix form. The convex lens 21c has a circular cone shape. In FIG. 14B, a line L16 represents a light intensity ratio of the luminescent panel 16 of FIG. 14A, and this is expressed as a relative value representing the light intensity as 1 when viewing the luminescent panel 901 from the normal line direction of the surface 902b as a comparative example. Here, there are illustrated cases that the apex angle β of the convex lens 21c is 90° and 100°, respectively. The luminescent panel 12' is brighter than the luminescent panel 901 over approximately 180° even if the apex angle β is either 90° or 100°. In particular, it demonstrates the brightness equal to or above the front face brightness of the luminescent panel 901 over approximately 30° on the right and left sides from the front face direction of the lens array substrate 21.

Although the concave mirror is formed by bonding the flat surface of the lens array having the reflecting film formed thereon to the cathode electrode in the foregoing embodiments, the present invention is not restricted to the above embodiments as long as the concave mirror faces the cathode electrode.

Figure 15:
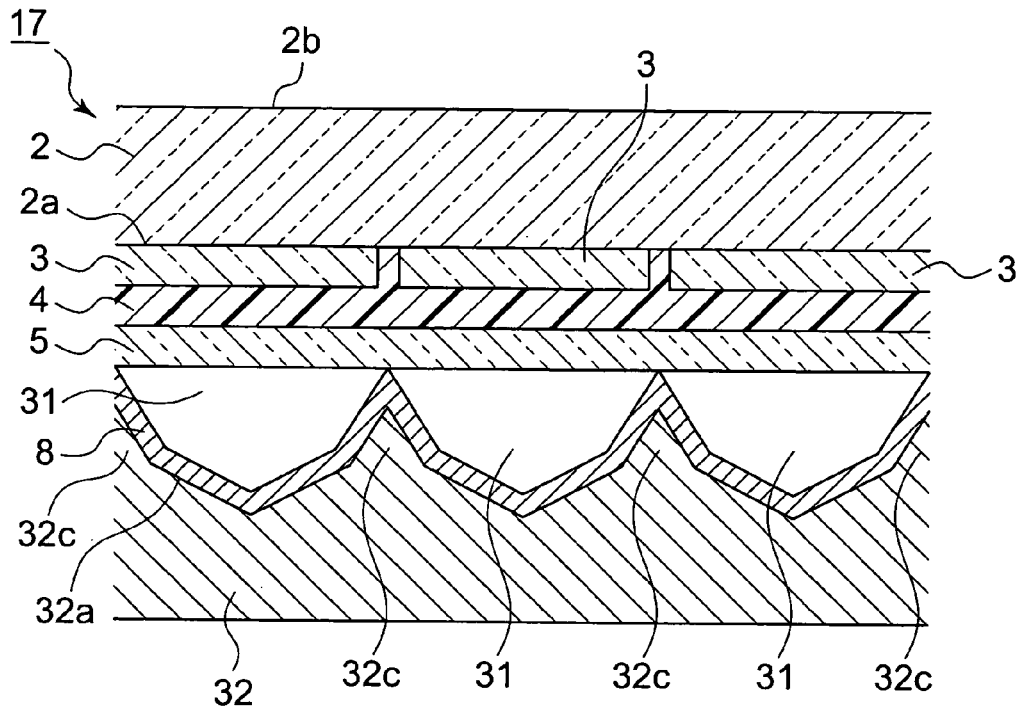
FIG. 15 is a cross-sectional view showing a part of a luminescent panel according to a fourteenth embodiment.

For example, in the luminescent panel 17 shown in FIG. 15, the reflecting film 8 is formed in such a manner that its outer surface (outer surface relative to the organic EL layer 4) is in contact with the irregular surface 32a of the opposed substrate 32. That is, since the shape of the reflecting film 8 can be formed in accordance with the shape of the irregular surface 32a of the opposed substrate 32, the directivity of the reflected light on the reflecting film 8 can be set by setting the shape of the irregular surface 32a of the opposed substrate 32. Additionally, spaces 31 are formed between the cathode electrode 5 and the reflecting film 8, an inert gas with a row refraction factor (e.g., a nitrogen gas, a helium gas, an argon gas, a neon gas and others) is filled in the spaces 31, thereby restricting corrosion of the cathode electrode 5 and the reflecting film 8.

As a method of manufacturing the luminescent panel 17, after forming the film of the anode electrode 3 on the flat surface 2a of the transparent substrate 2, the transistor or the partition wall (not shown) is formed according to needs, and the anode electrode 3, the organic EL layer 4 and the cathode electrode 5 are sequentially formed. Then, a concave portion 32c is formed on one surface of the opposed substrate 32 (the concave portion 32c is not formed at this moment) by the photolithography step.

The reflecting film 8 is formed on the irregular surface 32a of the opposed substrate 32 by the vapor deposition method or the like, the transparent substrate 2 and the opposed substrate 32 are attached to each other in such a manner that the reflecting film 8 is arranged on the cathode electrode 5 side, thereby bringing the luminescent panel 17 to completion. On the irregular surface 32a, a plurality of the concave portions 32c are patterned in the mesh formed as seen from the plane surface, and the spaces 31 are arranged in the matrix form as seen from the plane surface. It is to be noted that a silhouette of the space 31 has the same shape as a silhouette of the convex lens 7c shown in FIG. 1. It is desirable that the reflecting film 8 is in contact with the cathode electrode 5 in terms of the reflectivity or the contrast ratio. However, when a plurality of stripe electrodes constituting the cathode electrode 5 are provided and signals applied to the respective cathode electrode stripes are different from each other, it is desirable to interpose an insulating material so that the reflecting film 8 and the cathode electrode stripes are electrically insulated from each other. When the step of attaching the transparent substrate 2 and the opposed substrate 32 with each other is performed in the inert gas atmosphere, the space 31 has the inert gas atmosphere therein. Attaching the opposed substrate 32 having the reflecting film 8 formed thereon to the transparent substrate 2 forms concave mirrors facing the cathode electrode 5.

In regard to the luminescent panel 17, like reference numerals denote constituent elements equal to those in the luminescent panel 1.

Figure 16:
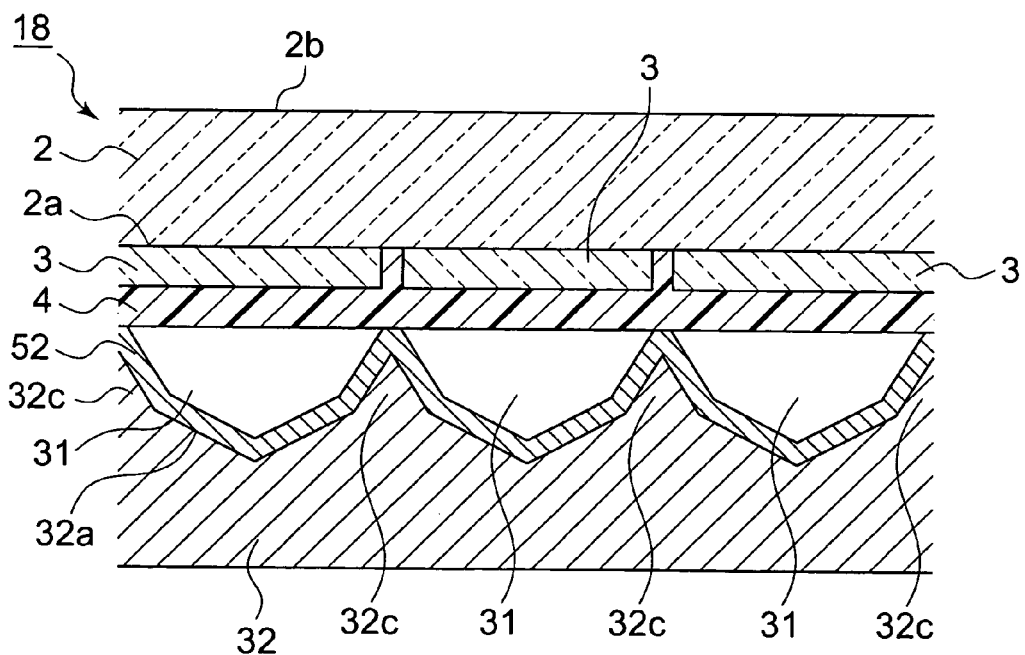
FIG. 16 is a cross-sectional view showing a part of a luminescent panel according to a fifteenth embodiment.

The reflecting film 8 of the luminescent panel 17 may also function as the cathode electrode. In this case, the film of the cathode electrode 5 does not have to be formed on the organic EL layer 4. FIG. 16 shows a luminescent panel as such an example. As to the luminescent panel 18, like reference numerals denote constituent elements equal to those in the luminescent panel 17. In the luminescent panel 18 shown in FIG. 16, the reflecting film 52 which reflects the visible light is formed on the irregular surface 32a of the opposed substrate 32, the spaces 31 is formed between the organic EL layer 4 and the reflecting film 52. The space 31 has the inert gas atmosphere (e.g., a nitrogen gas, a helium gas, an argon gas, a neon gas and others) therein. The reflecting film 52 serves as concave mirrors in the spaces 31. Further, the reflecting film 52 is in contact with the organic EL layer 4 at the parts of the concave portion 32c of the opposed substrate 32 and also functions as the cathode electrode. That is, the surface of the reflecting film 52 which is in contact with the organic EL layer 4 is formed of a material with a relatively low work function.

As a method of manufacturing the luminescent panel 18, after forming the film of the anode electrode 3 on the flat surface 2a of the transparent substrate 2, the transistor Tr or the partition wall 9 (not shown in FIG. 16) is formed according to needs, and the film of the organic EL layer 4 is formed on the surface of the anode electrode 3.

On the other hand, the concave portions 32c are formed on one surface of the opposed substrate 32 by the photolithography step.

Then, the above-described cathode electrode material is evaporated on the irregular surface 32a of the opposed substrate 32 in order to form the reflecting film 52, and this opposed substrate 3 is attached to the transparent substrate 2 so that the reflecting film 52 comes into contact with the organic EL layer 4 to form the spaces 31, thereby bringing the luminescent panel 18 to completion. When this step is carried out in the inert gas atmosphere, the spaces 31 has the inert gas atmosphere therein.

Figure 17:
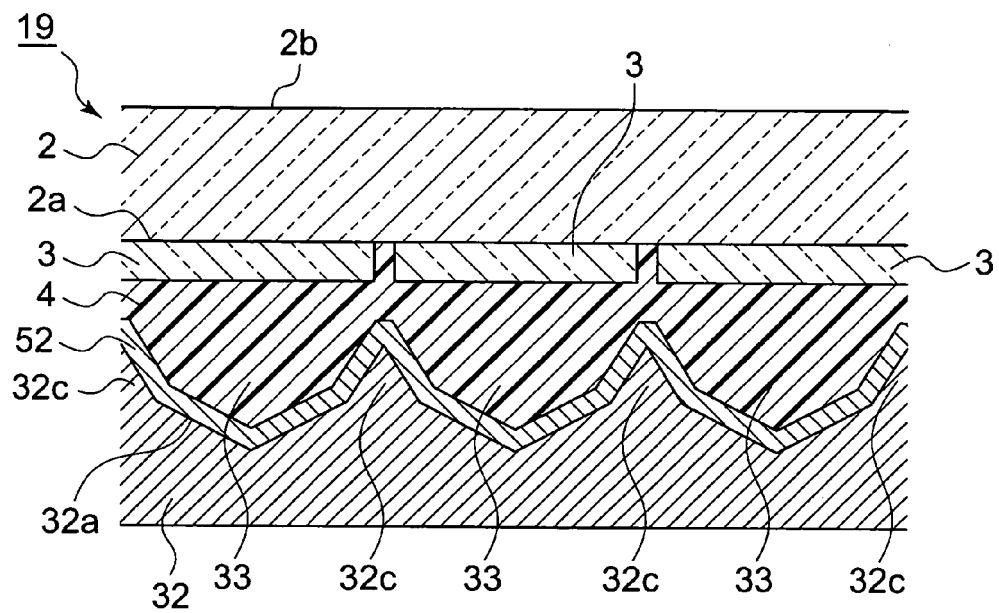
FIG. 17 is a cross-sectional view showing a part of a luminescent panel according to a sixteenth embodiment.

The space 31 of the luminescent panel 18 may be filled with the organic EL layer 4. FIG. 17 shows a luminescent panel 19 as such an example. As to the luminescent panel 19, like reference numerals denote constituent elements equal to those in the luminescent panel 18. In the luminescent panel 19 shown in FIG. 17, the reflecting film 52 is formed on the irregular surface 32a of the opposed substrate 32, and the organic EL layer 4 is formed between the anode electrode 3 and the reflecting film 52. Therefore, the reflecting film 52 has the concave shape with respect to the organic EL layer 4 and functions as concave mirrors. The organic EL layer 4 has a shape that the concave portions 33 corresponding to the concave portions 32c are continuous, and function as lenses with respect to the light transmitted through the organic EL layer 4. Additionally, the reflecting film 52 also serves as the cathode electrode, and has a laminated structure consisting of a first layer which is in contact with the organic EL layer 4 and has a relatively low work function and a second layer which is thicker than the first layer and has a relatively high work function. Further, the reflecting film 52 has the reflectivity with respect to the visible light.

Figure 18:
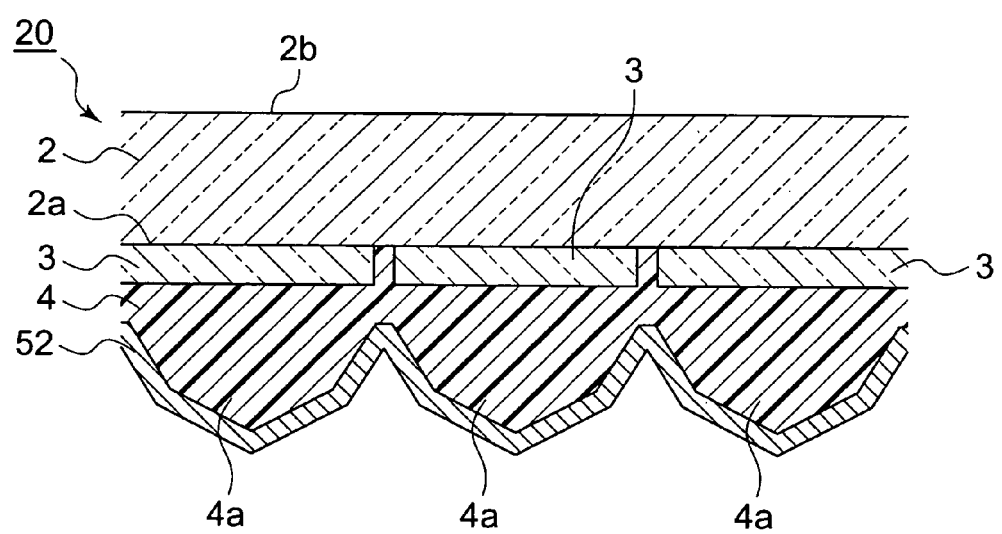
FIG. 18 is a cross-sectional view showing a part of a luminescent panel according to a seventeen embodiment.

The opposed substrate 32 of the luminescent panel 19 may not be provided. FIG. 18 shows a luminescent panel 20 of such an example. As to the luminescent panel 20, like reference numerals denote constituent elements equal to those in the luminescent panel 19.

As a method of manufacturing the luminescent panel 20, after forming the anode electrode 3 on the flat surface 2a of the transparent substrate 2, the film of the organic EL layer 4 is formed on the anode electrode 3. Then, embossing the organic EL layer 4 provides a shape that the concave portions 4a of the organic EL layer 4 are arranged in the matrix form when seen from the plane surface. Further, forming the reflecting film 52 on the organic EL layer 4, the reflecting film 52 functions as concave mirrors with respect to the organic EL layer 4.

Figure 19:
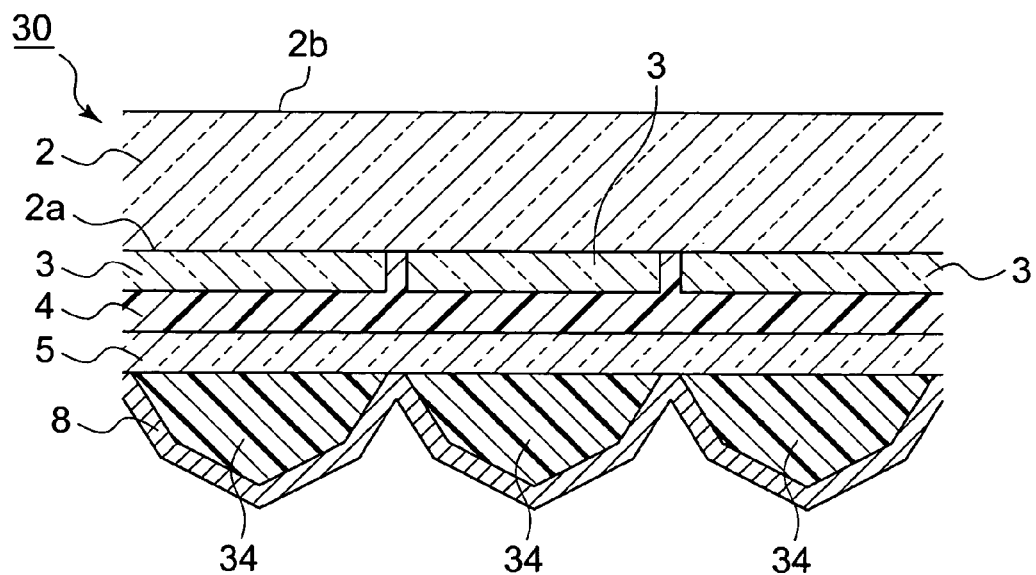
FIG. 19 is a cross-sectional view showing a part of a luminescent panel according to an eighteen embodiment.

In a luminescent panel 30 shown in FIG. 19, a transparent resin which transmits the visible light therethrough is filled in the space 31 in the luminescent panel 17 depicted in FIG. 15. Although a method of manufacturing the luminescent panel 30 is substantially equal to the method of manufacturing the luminescent panel 17, there is required a step of filling the transparent resin in the space 31 of the irregular surface 32a after forming the reflecting film 8 on the irregular surface 32a of the opposed substrate 32. Thereafter, when the irregular surface 32a having the transparent resin 34 filled therein is bonded to the cathode electrode 5, the luminescent panel 30 is brought to completion. It is desirable for the transparent resin 34 to have a refraction factor substantially equal to that of the cathode electrode 5 and also have a low transmissivity with respect to oxygen or water.

Figure 20:
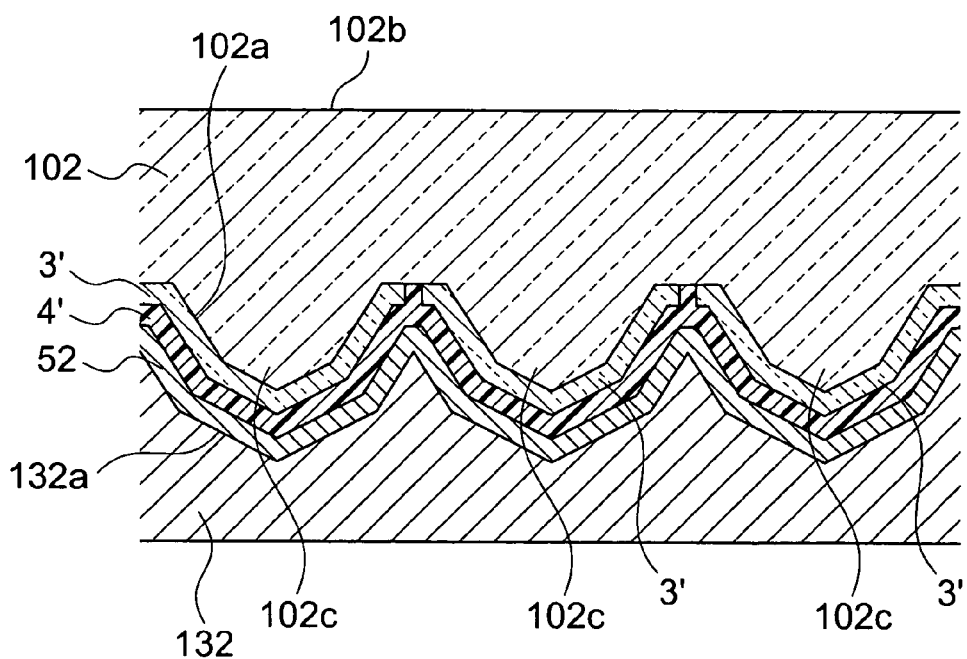
FIG. 20 is a cross-sectional view showing a part of a luminescent panel according to a nineteenth embodiment.

In a luminescent panel 19' shown in FIG. 20, the transparent substrate 2 of the luminescent panel 19 illustrated in FIG. 17 is substantially substituted by a lens array 102, and a surface 102a on which the organic EL elements are to be formed is an irregular surface on which convex lenses 102c are arranged in the matrix form whilst a surface 102b on the back side is flat. After patterning the anode electrode 3' on the surface 102a, the organic EL layer 4' and the cathode electrode 52 which also functions as the reflecting film are appropriately formed. At this moment, the anode electrode 3', the organic EL layer 4' and the cathode electrode 52 are formed along the convex shapes of the convex lenses 102c. A resin is applied to the surface of the cathode electrode 52 by spin coating, thereby forming the opposed substrate 132 which also functions as a sealing film.

In order to improve the luminescent brightness of the luminescent panel, the following structure may be adopted.

Figure 21:
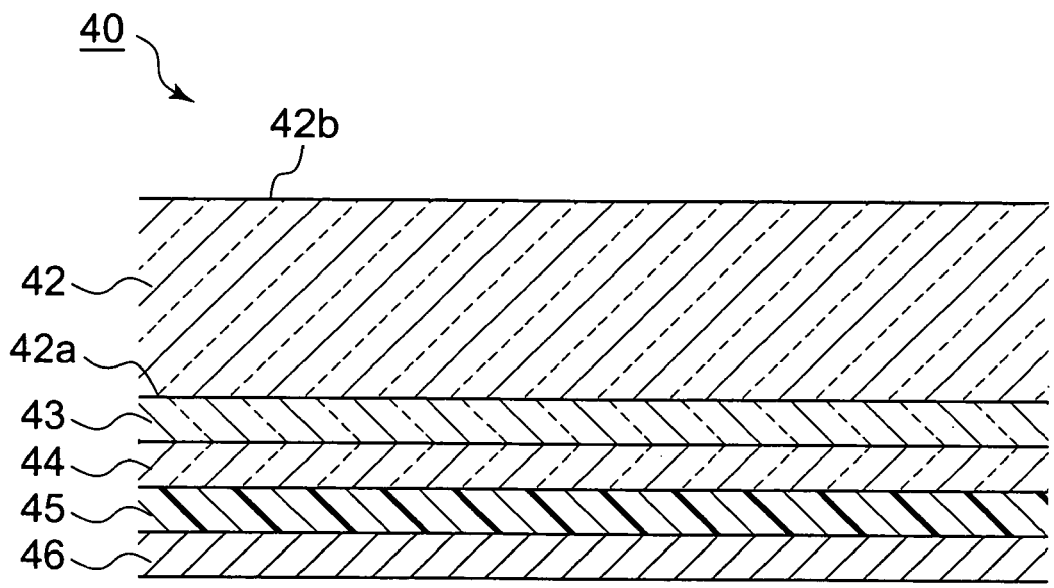
FIG. 21 is a cross-sectional view showing a part of a luminescent panel according to a twenty embodiment.

As shown in FIG. 21, a luminescent panel 40 has as a basic structure a laminated structure that a low-refraction factor material layer 43, the anode electrode 44, the organic EL layer 45 and the cathode electrode 46 are sequentially laminated on one flat surface 42a of the substantially tabular transparent substrate 42.

The transparent substrate 42 has a transmissivity with respect to the invisible light and an insulating property, and is formed of a material such as a borosilicate glass, a quartz glass or any other glass. A refraction factor of the transparent substrate 42 is approximately 1.5.

The film of the low-refraction factor material layer 43 is formed on one flat surface 42a of the transparent substrate 42. The low-refraction factor material layer 43 has a transmissivity with respect to the visible light, and a refraction factor of the low-refraction factor material layer 43 is smaller than that of the transparent substrate 42. Further, a film thickness of the low-refraction factor material layer 43 is sufficiently longer than a wavelength of the visible light. As the low-refraction factor material layer 43, a fluorocarbon resin is appropriate. There are, e.g., PTFE (refraction factor: 1.35), PFA (refraction factor: 1.35), PFEP (refraction factor: 1.34), MEX-FLON-H15 (refraction factor: 1.35, manufactured by Nippon Mektron, Ltd.), CYTOP (refraction factor: 1.34, manufactured by Asahi Glass Company) and others.

The film of the anode electrode 44 is formed on the low-refraction factor material layer 43. The anode electrode 44 has an electroconductivity and a transmissivity with respect to the visible light. Furthermore, as the anode electrode 44, one which can efficiently inject the electron holes into the organic EL layer 45 is preferable. The anode electrode 44 is formed of, e.g., an indium-tin-oxide (ITO), a zinc-doped indium oxide (IZO), an indium oxide ($In_2O_3$), a tin oxide ($SnO_2$) or a zinc oxide (ZnO) and others. It is to be noted that, if the anode electrode 44 is formed of ITO, its refraction factor is approximately 2.0, which is higher than a refraction factor of the low-refraction factor material layer 43 and also higher than a refraction factor of the transparent substrate 42.

The film of the organic EL layer 45 is formed on the anode electrode 44. The organic EL layer 45 may have a three-layer structure consisting of an electron hole transport layer, a narrow-sense luminescent layer and an electron transport layer superimposed on the anode layer 44 in the mentioned order, or a two-layer structure consisting of the electron hole transport layer and the narrow-sense luminescent layer superimposed on the anode electrode 3, or a single layer structure consisting of the narrow-sense luminescent layer, or a laminated structure that an injection layer for electrons or electron holes is interposed between appropriate layers in such layer structures, or any other layer structure.

That is, the organic EL layer 45 has a function to inject electron holes and electrons, a function to transport electron holes and electrons, and a function to generate excitons by re-combining of electron holes and electrons to emit the light. Although the organic EL layer 45 contains a luminescent material (fluorescent material), the luminescent material may be based on a high-molecular material or a low-molecular material.

The film of the cathode electrode 46 is formed on the organic EL layer 45. The cathode electrode 46 has a reflectivity with respect to the visible light. Furthermore, it is desirable for the cathode electrode 46 to have a relatively low work function.

As a method of manufacturing the luminescent panel 40, a fluorocarbon resin is applied on one flat surface 42a of the transparent substrate 42 and incineration is performed, thereby forming a low-refraction factor material layer 43 having a film thickness of approximately 100 μm. Thereafter, the film of the anode electrode 44 is formed on the low-refraction factor material layer 43 at approximately 150° C. by a plasma ion plating method, and the film of the organic EL layer 45 is formed on the anode electrode 44. Then, the cathode electrode 46 is formed on the organic EL layer 45 by the vapor deposition method.

Comparing the luminescent panel 40 with a luminescent panel without the low-refraction factor material layer 43, when various conditions (e.g., a film thickness of each layer, a level of an application voltage, a luminescent area, a level of a passing current and others) are equal, the luminescent brightness of the luminescent panel 40 is approximately 1.5-fold of the luminescent brightness of the luminescent panel without the low-refraction factor material layer 43. That is because the light is refracted when entering transparent substrate 42 from the low-refraction factor material layer 43 by forming the film of the low-refraction factor material layer 43, a quantity of the light which has approximated 90° with respect to the light emitting surface 42b is increased, and a quantity of the light totally reflected on the light emitting surface 42b is thereby decreased.

The low-refraction factor material layer 43 may be a material including air gaps (e.g., silica aerogel: 90% of its cubic content is air gaps), or an ultraviolet curing resin material including air gaps. The material including the air gap or the resin has a substantial refraction factor lower than a refraction factor of a bulk material, and also lower than a refraction factor of the transparent substrate 42.

The present invention is not restricted to the foregoing embodiments, and various improvements and changes in design may be carried out without departing from the scope of the invention.

For example, although there is provided a structure that the anode electrode, the organic EL layer and the cathode electrode are sequentially superimposed from the transparent substrate 2, the transparent substrate 42, the lens array substrate 21 or the lens array 22, there may be adopted a laminated structure that the cathode electrode (which has the transmissivity with respect to the visible light), the organic EL layer, and the anode electrode (which has the transmissivity with respect to the visible light when it does not function as the reflecting film, and does not have the transmissivity with respect to the visible light but the reflectivity when it also functions as the reflecting film) are superimposed in the illustrated order from the transparent substrate 2, the transparent substrate 42, the lens array substrate 21 or the lens array 22.

Moreover, although description has been given as to the case that organic EL element that the anode electrode, the organic EL layer and the cathode electrode are superimposed in the mentioned order from the transparent substrate 2, the transparent substrate 42, the lens array substrate 21 or the lens array 22 is applied to the luminescent panel, it is possible to apply to the luminescent panel an inorganic EL element that a first electrode (which has the transmissivity with respect to the visible light), an insulating film (which has the transmissivity with respect to the visible light), an inorganic luminescent layer, an insulating film (which has the transmissivity with respect to the visible light) and a second electrode (which has the transmissivity with respect to the visible light when it does not function as the reflecting film, and does not have the transmissivity with respect to the visible light but the reflectivity when it also functions as the reflecting film) are superimposed in the mentioned order from the transparent substrate 2, the transparent substrate 42, the lens array substrate 21 or the lens array 22.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A luminescent panel comprising:
a transparent substrate;
a first transparent electrode provided on the transparent substrate;
a luminescent layer provided on the first transparent electrode;

a second transparent electrode provided on the luminescent layer, the first transparent electrode, the luminescent layer and the second transparent electrode defining at least one pixel; and a reflecting film which reflects light emitted from the luminescent layer through the second transparent electrode, such that the reflected light is outwardly emitted from the transparent substrate;

wherein an inner surface of the reflecting film defines a space, and the reflecting film has a shape such that the reflecting film controls a direction of the reflected light to condense the reflected light; and wherein the space is filled with an inert gas.

* * * * *

UNITED STATES PATENT AND TRADEMARK OFFICE
CERTIFICATE OF CORRECTION

PATENT NO.         : 7,511,419 B2
APPLICATION NO. : 10/484671
DATED                : March 31, 2009
INVENTOR(S)       : Manabu Takei et al.

It is certified that error appears in the above-identified patent and that said Letters Patent is hereby corrected as shown below:

On the Title Page:

Under Item (22), PCT Filed;

change "May 14, 2002" to --May 14, 2003--

Signed and Sealed this

Eighteenth Day of August, 2009

David J. Kappos
*Director of the United States Patent and Trademark Office*